US009521305B2

(12) United States Patent
Kaioka et al.

(10) Patent No.: US 9,521,305 B2
(45) Date of Patent: Dec. 13, 2016

(54) OPTICAL MEMBER CONVEYING DEVICE

(71) Applicant: SHARP KABUSHIKI KAISHA, Osaka-shi, Osaka (JP)

(72) Inventors: Shinji Kaioka, Osaka (JP); Akitoshi Ikuno, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 73 days.

(21) Appl. No.: 14/436,961

(22) PCT Filed: Sep. 24, 2013

(86) PCT No.: PCT/JP2013/075689
§ 371 (c)(1),
(2) Date: Apr. 20, 2015

(87) PCT Pub. No.: WO2014/065058
PCT Pub. Date: May 1, 2014

(65) Prior Publication Data
US 2015/0256726 A1    Sep. 10, 2015

(30) Foreign Application Priority Data

Oct. 26, 2012  (JP) ................. 2012-237199

(51) Int. Cl.
G03B 17/00    (2006.01)
H04N 5/225    (2006.01)
(Continued)

(52) U.S. Cl.
CPC .......... H04N 5/2254 (2013.01); G01B 11/26 (2013.01); G01B 11/272 (2013.01); G02B 7/02 (2013.01); G02B 27/62 (2013.01); H04N 5/2257 (2013.01)

(58) Field of Classification Search
USPC ........................................ 396/529
See application file for complete search history.

(56) References Cited

U.S. PATENT DOCUMENTS 6,546,126 B1 *   4/2003   Wittmann ............ G01J 1/20
                                                  250/559.46
7,540,080 B2 *   6/2009   Fukunaga ........... G02B 6/4224
                                                     29/743
(Continued)

FOREIGN PATENT DOCUMENTS

CN    101574025 A    11/2009
JP    11-337329    12/1999
(Continued)

OTHER PUBLICATIONS

International Search Report for PCT/JP2013/075689 mailed Jan. 7, 2014, four pages.
(Continued)

*Primary Examiner* — Rodney Fuller
(74) *Attorney, Agent, or Firm* — Nixon & Vanderhye P.C.

(57) ABSTRACT

An optical member conveying device (90) of an embodiment of the present invention includes: a small LED illumination device (13) which (i) is included in a lens unit suction head (14) which adheres to a top surface of a lens section (50) and (ii) emits light from above the top surface of the lens section (50) toward an opening hole (3a) from which light enters, the opening hole (3a) being provided on the top surface of the lens section (50); and a control section which controls the lens unit suction head (14) to carry out an alignment of the lens section (50) in accordance with a projection image obtained by projecting, by use of light emitted from the small LED illumination device (13), the opening hole (3a) on a side of a back surface of the lens section (50).

6 Claims, 21 Drawing Sheets

(51) Int. Cl.
*G01B 11/26* (2006.01)
*G01B 11/27* (2006.01)
*G02B 7/02* (2006.01)
*G02B 27/62* (2006.01)

(56) References Cited

U.S. PATENT DOCUMENTS

| | | | |
|---|---|---|---|
| 7,617,597 B2* | 11/2009 | Okuda | H05K 13/0413 |
| | | | 29/740 |
| 8,390,725 B2* | 3/2013 | Sekimoto | H04N 5/2254 |
| | | | 348/340 |
| 2007/0121222 A1 | 5/2007 | Watanabe | |
| 2010/0097461 A1 | 4/2010 | Utsumi et al. | |
| 2010/0110270 A1 | 5/2010 | Sekimoto et al. | |
| 2011/0050978 A1 | 3/2011 | Yano et al. | |
| 2011/0097484 A1* | 4/2011 | Sakai | B05C 13/025 |
| | | | 427/164 |

FOREIGN PATENT DOCUMENTS

| | | |
|---|---|---|
| JP | 2005-227620 | 8/2005 |
| JP | 2007-155761 | 6/2007 |
| JP | 2008-181981 | 8/2008 |
| JP | 2010-134409 | 6/2010 |
| JP | 2010-197959 | 9/2010 |
| JP | 2011-048304 | 3/2011 |
| JP | 2011133509 | 7/2011 |
| JP | 2012-033734 | 2/2012 |

OTHER PUBLICATIONS

Non-English Written Opinion of the ISA for PCT/JP2013/075689 mailed Jan. 7, 2014, four pages.

* cited by examiner

BACK SURFACE DIAGRAM

OPTICAL MEMBER CONVEYING DEVICE

This application is the U.S. national phase of International Application No. PCT/JP2013/075689 filed 24 Sept. 2013 which designated the U.S. and claims priority to JP Patent Application No. 2012-237199 filed 26 Oct. 2012, the entire contents of each of which are hereby incorporated by reference.

TECHNICAL FIELD

The present invention relates to an optical member conveying device for positioning a lens for a camera module which is to be mounted in an electronic device such as a mobile phone. The present invention particularly relates to an optical member conveying device which is capable of more accurately positioning a lens section including an imaging lens with respect to an imaging sensor section.

BACKGROUND ART

A camera module has been mounted in various electronic devices such as a mobile phone and a smartphone. Examples of camera modules encompass (i) a conventional camera module in which (a) no lens driving device is included and (b) a lens is held only by a holder and (ii) a camera module which uses a lens driving device to carry out an automatic focusing function and a camera shake correction function. These camera modules have been already distributed to the market. Examples of lens driving devices, i.e., actuators, encompass various types, such as a stepping motor, a piezoelectric element, and a VCM (Voice Coil Motor), and these lens driving devices have been already distributed to the market. Although the market has a strong demand for a reduction in size of the camera module, a structure of the camera module has become complicated, and thus a higher accuracy is required for positioning a lens with respect to an imaging element.

A camera module is usually produced in such a manner that while a lens section, in which a lens unit is incorporated into an actuator unit in advance, is being aligned with a sensor section in which members such as a sensor chip, a wire, a cover glass, and a sensor cover are incorporated into a substrate, the lens section is bonded to the sensor section by use of an adhesive resin.

Many methods are proposed for the above alignment. For example, a method similar to the one shown in FIGS. 23 and 24 is known. According to the method, a lens section is illuminated by a ring illumination device 117 from a back surface side of the lens section, while being vacuum-sucked by a suction head 114. Further, an image recognition camera unit 116 carries out image recognition of each of (i) an edge 103*e* of a lens barrel 103 and (ii) an edge 102*e* of a retainer 102. While the lens section is being aligned with an effective pixel area of an imaging sensor chip with respect to which effective pixel area image recognition has been carried out in a manner similar to the above image recognition, the lens section is mounted, by a device, on a sensor section to which an adhesive resin has been applied in advance.

Patent Literature 1 also discloses a method of carrying out the above alignment. Patent Literature 1 discloses an electronic part mounting device for mounting, on a circuit substrate (not illustrated), an electronic part 203 illustrated in FIG. 25. The electronic part mounting device 220 includes (i) support columns 221*a* and 221*b* which are integrated with a head unit and (ii) a CCD camera 222 which (a) is provided at an end part of the support column 221*a* and (b) captures, from obliquely below, an image of an image-captured surface of the electronic part 203 opposite to an adhesion surface, adhered by an adhesion nozzle support column 212, of the electronic part 203. The electronic part mounting device 220 further includes an illumination device 223 which (i) is provided at an end part of the support column 221*b* and (ii) illuminates a bottom surface, adhered by the adhesion nozzle support column 212, of the electronic part 203. In this case, the illumination device 223 irradiates the electronic part 203 with light from obliquely below, specifically, from a position linearly symmetric to the CCD camera 222 with respect to an axis of an adhesion head 212*a*. A reference sign 224 indicates a course of light emitted from the illumination device 223. The CCD camera 222 receives light reflected from the bottom surface of the electronic part 203. An image captured by the CCD camera 222 is processed. An edge point in the image is then extracted so as to generate an edge image. An outer edge part of the electronic part 203 is then determined on the basis of the edge image thus generated, so as to check for a positional displacement.

On the other hand, Patent Literature 2 discloses a technique for carrying out a tilt correction by use of parts which are in contact and are engaged with each other.

CITATION LIST

Patent Literatures

Patent Literature 1
Japanese Patent Application Publication, Tokukai, No. 2012-33734 A (Publication Date: Feb. 16, 2012)
Japanese Patent Application Publication, Tokukai, No. 2010-134409 A (Publication Date: Jun. 17, 2010)

SUMMARY OF INVENTION

Technical Problem

With conventional techniques, an illumination device has limitations, so that illumination and image recognition can be carried out only from a back surface side of an object. As such, a reduction in size of a product and a reduction in thickness of a resin molded part may make it difficult to carry out the image recognition and, as a result, misrecognition of an image may occur to result in a decrease in positional accuracy as well as accompanying occurrence of a defect.

In order to meet a demand for a smaller camera module having a high camera performance, some camera modules have a lens barrel that is designed to have a wall thickness of not more than 200 μm. In such a camera module, a ratio of an angle R to a flat part, such as an edge, of a bottom surface of the lens barrel is larger as compared with a camera module in which a lens barrel has a wall thickness of not less than 300 μm, and this causes an edge image to be unclear. The camera module whose lens barrel has a wall thickness of not more than 200 μm is easily affected by an adhesion, to the bottom surface of the lens barrel, of a resin which bonds a retainer that supports a lens section and the lens barrel to each other. Thus, when image recognition of the bottom surface part of the lens barrel is carried out as illustrated in FIGS. 23 and 24, a center position of the bottom surface part of the lens barrel may be recognized to be displaced by approximately 100 μm from an actual center position. This may cause insufficient accuracy in image recognition, and may cause a defective product, accordingly.

That is, as a result of a reduction in size of a camera module and an accompanying reduction in size of a lens unit, a lens barrel and a retainer have also become smaller and thinner and, accordingly, (i) conditions of a surface and an edge of each of the lens barrel and the retainer have become unstable and (ii) a fixing agent which fixes the lens barrel to the retainer has become more likely to overflow to the surface and the edge of each of the lens barrel and the retainer. This may increase misrecognition in image recognition of the bottom surface part of the lens barrel, and thus may make it difficult to accurately mount the lens barrel and the retainer.

The inventors of the present invention studied and found that although accuracy in image recognition was slightly improved when an incident angle of illumination was changed, a further improvement is necessary to ensure an accurate alignment.

The present invention has been made in view of the problems, and an object of the present invention is to provide an optical member conveying device which enables to (i) accurately align, with a sensor section, a lens section having a flexible design and shape so as to achieve a reduction in size of a camera module.

Solution to Problem

In order to attain the object, an optical member conveying device in accordance with the present invention is an optical member conveying device which (i) conveys, to a given position on a side, from which light enters, of a sensor section including a photoelectric conversion section, an optical member into which a lens is incorporated and (ii) aligns the optical member with the given position of the sensor section, including: a holding section including at least one of (i) an adhesion head that changes a position and an orientation of the optical member while (a) adhering to a top surface of the optical member which top surface is an outer surface on a side, from which light enters, of the optical member and (b) holding the optical member and (ii) a chucking or suction device that changes the position and the orientation of the optical member while (a) making contact with a side surface of the optical member which side surface is adjacent to the top surface and (b) holding the optical member; and a control section which controls the holding section to mount, in accordance with a projection image, the optical member in the given position of the sensor section while (i) the holding section is holding the optical member and (ii) a light emitting element which emits light from above the top surface of the optical member toward an opening hole (a) from which light enters and (b) which is provided on the top surface of the optical member is provided, the projection image being obtained by projecting, by use of light which is emitted from the light emitting element, the opening hole on a side of a back surface which side is opposite to a side of the top surface of the optical member.

Advantageous Effects of Invention

With the present invention, light is emitted from a top surface of a lens unit while the top surface of the lens unit is being sucked.

Accordingly, it is possible to carry out image recognition of an edge of a lens opening hole in accordance with a more accurate position of an optical axis. This can eliminate limitations on reducing a size of a camera module. Further, this increases (i) a region in which a lens barrel cylindrical section can be invisible when viewed from a back surface of a lens section and (ii) a region in which a resin can be applied to an edge of the back surface of the lens section. Even in a case where a tilt is occurring in the lens section, the tilt can be corrected before the lens section is mounted on the sensor section. This reduces a performance management value of a member. Accordingly, it is possible to reduce a cost and make full use of various products.

DESCRIPTION OF EMBODIMENTS

The following description will discuss, with reference to FIGS. 1 through 22, an embodiment of an optical member conveying device in accordance with the present invention. Note that before a discussion on the optical member conveying device of the present embodiment, the following description will discuss a camera module including a lens section which is to be conveyed by the optical member conveying device.

Figure 1:
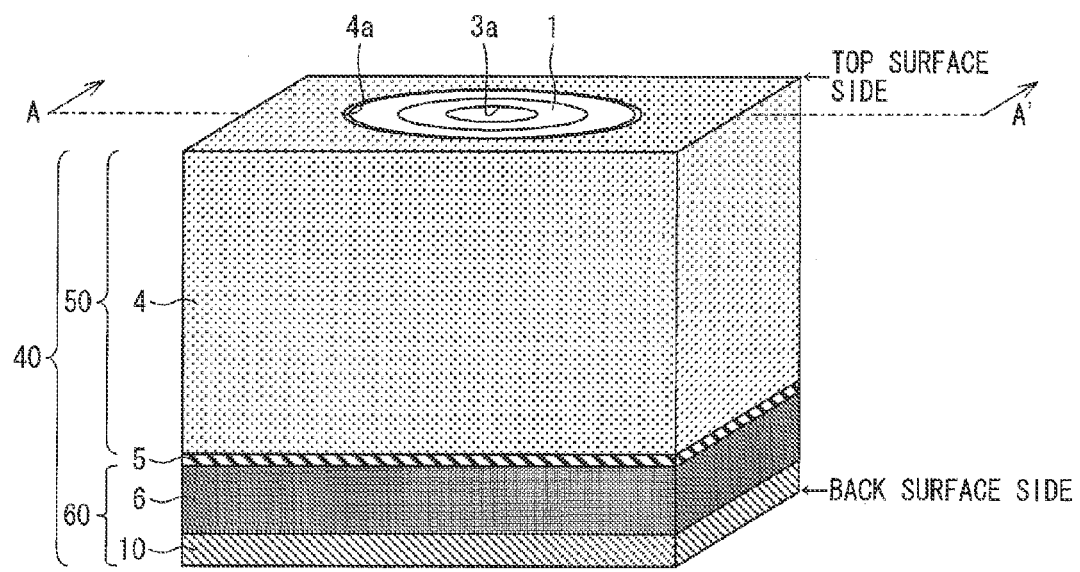
FIG. 1 is a perspective view illustrating a camera module including a sensor section and a lens section which is conveyed and is aligned with the sensor section by an optical conveying device of an embodiment of the present invention.
Figure 2:
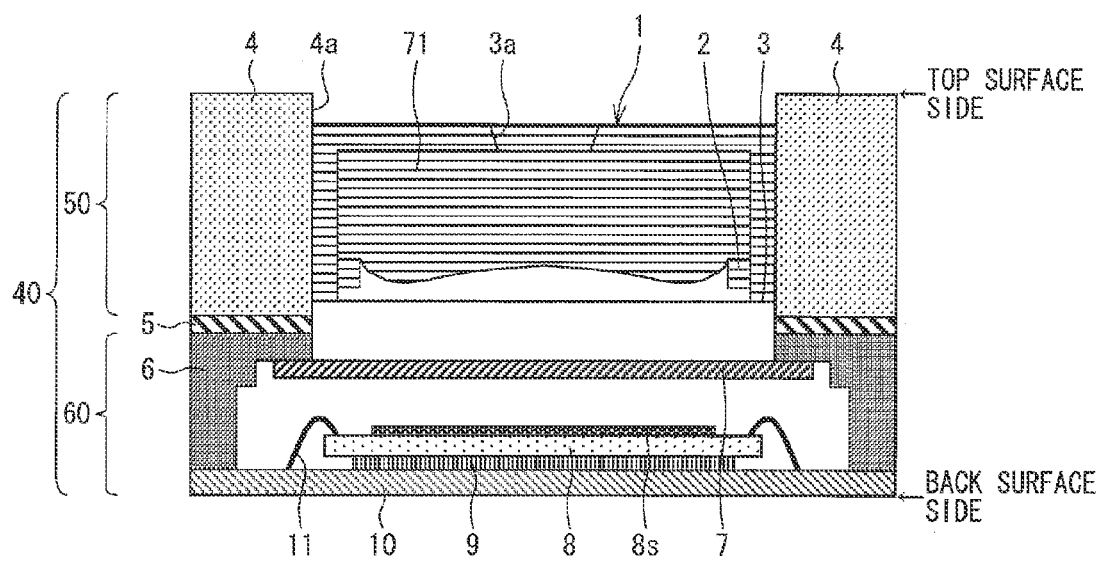
FIG. 2 is a cross-sectional view, taken along a cutting line A-A' illustrated in FIG. 1, of the camera module illustrated in FIG. 1.

FIG. 1 is a perspective view illustrating a camera module 40 obtained by conveying a lens section, aligning the lens section with the sensor section, and then fixing the lens section to the sensor section by the optical member conveying device of the present embodiment. FIG. 2 is a cross-sectional view, taken along a cutting line A-A' illustrated in FIG. 1, of the camera module 40.

The following description will first discuss a configuration of the camera module 40 and will then discuss a method of conveying the lens section and aligning the lens section with the sensor section.

(1) Configuration of Camera Module

As illustrated in FIGS. 1 and 2, the camera module 40 is a module in which a lens section 50 (optical member) is bonded and fixed to a sensor section 60, via an adhesive part, by use of a well-known adhesive such as an ultraviolet curing resin. As illustrated in FIG. 1, the lens section 50 is provided on a top surface side of the camera module 40. The sensor section 60 is provided on a side (hereinafter referred to as a back surface side or a side of a back surface) opposite to the top surface side of the camera module 40.

(Lens Section 50)

The lens section 50 includes an actuator unit 4 which serves as an outer casing. An opening part 4a which is formed on the actuator unit 4 is provided on the top surface of the camera module 40, so as to allow light to be introduced into the camera module 40.

The following description will discuss in detail the lens section 50 with reference to FIG. 2. The lens section 50 is configured such that a lens unit 1 is incorporated into the actuator unit 4. The lens unit 1 includes an imaging lens 71, a lens barrel 3 storing the imaging lens 71, and a retainer 2 which is a lens barrel-holding ring for holding the imaging lens 71 in the lens barrel 3. The lens barrel 3 has a cylindrical structure, and a back surface of the lens barrel 3 has a relatively large opening so as to allow the imaging lens 71 to be inserted into the cylindrical structure. Further, an opening hole 3a, which is smaller than the imaging lens 71 in diameter, is provided on a top surface side of the lens barrel 3. A center axis of the opening hole 3a coincides with a center axis of the opening part 4a provided on the actuator unit 4. Light introduced from the opening part 4a provided on the actuator unit 4 travels through the opening hole 3a of the lens barrel 3 and then enters the imaging lens 71 from the top surface side. The actuator unit 4, which includes an actuator (not illustrated), can move the lens unit 1 in (i) a direction vertical to an optical axis of the imaging lens 71 and (ii) a direction parallel to the optical axis of the imaging lens 71. This enables automatic focusing and camera shake correction.

Note that the present invention directly relates to neither of a specific configuration and a specific operation of the actuator unit 4, and thus descriptions of the specific configuration and the specific operation of the actuator unit 4 are omitted.

Similarly, the lens section 50 can include another component. That is, it is only necessary that the lens section 50 include at least the imaging lens 71, and other components are optional. The lens section 50 can lack at least one of the above components other than the imaging lens 71. Alternatively, the lens section 50 can include another component which is not described above. That is, one of features of the present invention is that an optical system including the imaging lens 71 is aligned with an imaging system including an imaging sensor chip. Accordingly, specific components of the optical system and the imaging system are not limited to the components descend above.

Figure 3:
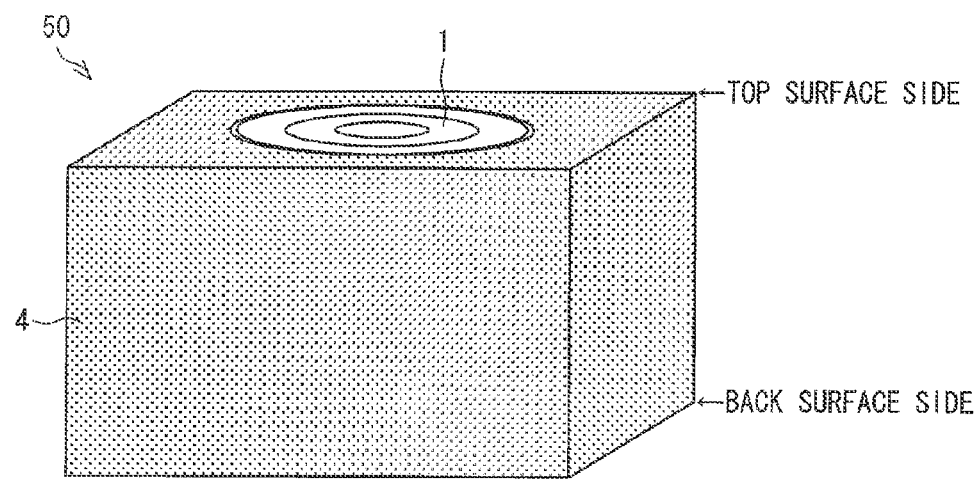
FIG. 3 is a perspective view illustrating a lens section (an actuator including a lens unit) included in the camera module illustrated in FIG. 1.
Figure 4:
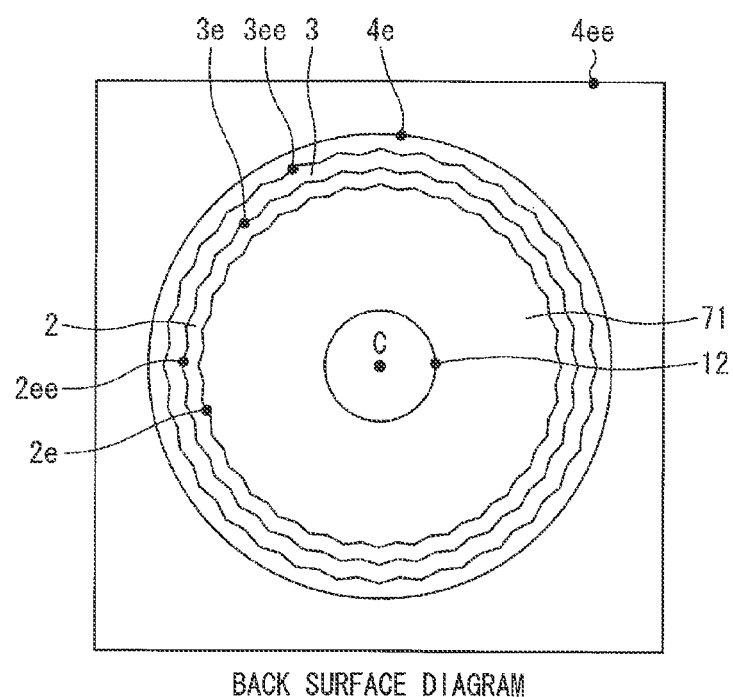
FIG. 4 is a side (back surface) view illustrating the lens section (the actuator including the lens unit) included in the camera module illustrated in FIG. 1.

FIG. 3 is a perspective view illustrating the lens section 50 which is solely separated. FIG. 4 is a back surface view illustrating the lens section 50 illustrated in FIG. 3, when viewed from a back surface side of the lens section 50. As illustrated in FIG. 3, a back surface side of the actuator unit 4 has a large opening. When the lens section 50 is viewed from the back surface side, an outer edge 4ee of the actuator unit 4, which is located outermost, an inner edge 4e of the actuator unit 4, an outer edge 3ee of the lens barrel 3, an inner edge 3e of the lens barrel 3, an outer edge 2ee of the retainer 2, an inner edge 2e of the retainer 2, and the imaging lens 71 are arranged in this order toward a center C of an optical axis of the lens section 50.

Note here that, as described later, a reference sign 12 in FIG. 4 indicates an outer edge of light which (i) is emitted from an LED included in the optical member conveying device of the present embodiment and then (ii) travels through a lens aperture diaphragm hole. Note that in a front diaphragm lens such as the lens of the camera module 40 of the present embodiment, the lens aperture diaphragm hole is identical to the opening hole 3a of the lens barrel 3. In a middle diaphragm lens, on the other hand, a lens aperture diaphragm hole is a hole of a diaphragm plate in the lens. The outer edge 12 will be described later.

(Sensor Section 60)

As illustrated in FIGS. 1 and 2, the sensor section 60 is bonded and fixed to the back surface side of the actuator unit 4 of the lens section 50 via an adhesive part 5. The sensor section 60 includes (i) a substrate 10 on which an imaging sensor chip (described later) is provided and (ii) a sensor cover 6. A top surface side of the sensor cover 6 faces the back surface side of the actuator unit 4 of the lens section 50 via an adhesive.

Figure 5:
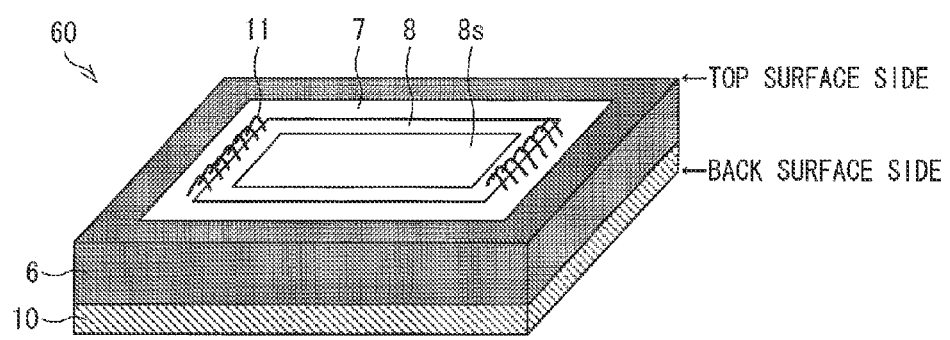
FIG. 5 is a perspective view illustrating the sensor section included in the camera module illustrated in FIG. 1.
Figure 6:
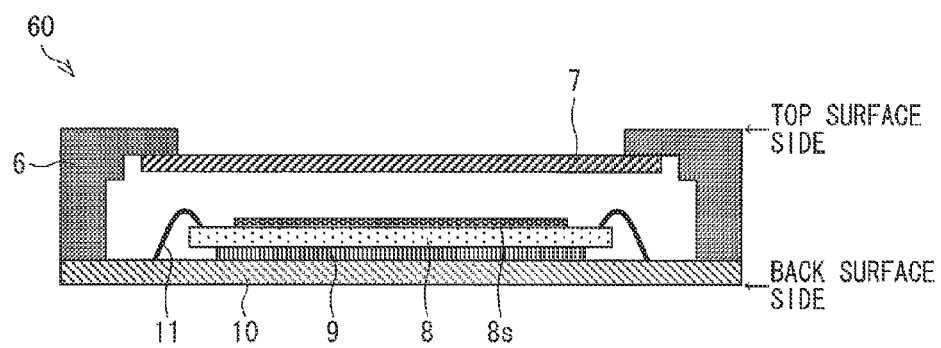
FIG. 6 is a cross-sectional view illustrating the sensor section included in the camera module illustrated in FIG. 1.

FIG. 5 is a perspective view illustrating a sensor section 60 which is solely separated from the camera module 40 illustrated in FIG. 1. FIG. 6 is a cross-sectional view, taken along a cutting line A-A' of FIG. 1, illustrating the sensor section 60. A cross section illustrated in FIG. 6 is identical to that of the sensor section 60 illustrated in FIG. 2.

As illustrated in FIGS. 2, 5, and 6, the sensor section 60 is configured such that an imaging sensor chip 8, a wire 11, a cover glass 7, and the sensor cover 6 are provided on the substrate 10. As illustrated in FIGS. 2 and 6, the imaging sensor chip 8 is bonded and fixed to a surface of the substrate 10 with an adhesive resin 9. Further, an effective pixel area 8s is defined on the imaging sensor chip 8, and the camera module 40 (FIG. 1) carries out a photoelectric conversion of light received in the effective pixel area 8s.

In other words, the lens section 50 needs to cause light to enter the effective pixel area 8s of the imaging sensor chip 8. This requires the lens section 50 to be accurately aligned with the sensor section 60 when the lens section 50 is bonded (is bonded and fixed) to the sensor section 60. The optical member conveying device of the present embodiment can accurately align the lens section 50 with the sensor section 60 due to having a configuration described later. The following description shows a key point of the present embodiment by discussing production of a camera module, mainly (i) an alignment of the lens section 50 with the sensor section 60 and (ii) bonding and fixing of the lens section 50 to the sensor section 60.

(2) Production of Camera Module

According to the present embodiment, in a process of producing the camera module 40, an optical member conveying device 90 is used in a step of assembling a camera module in which step (i) the lens section 50 illustrated in FIG. 3 is aligned with the sensor section 60 illustrated in FIG. 5 and (ii) the lens section 50 is fixed to the sensor section 60 via the adhesive part 5.

Figure 7:
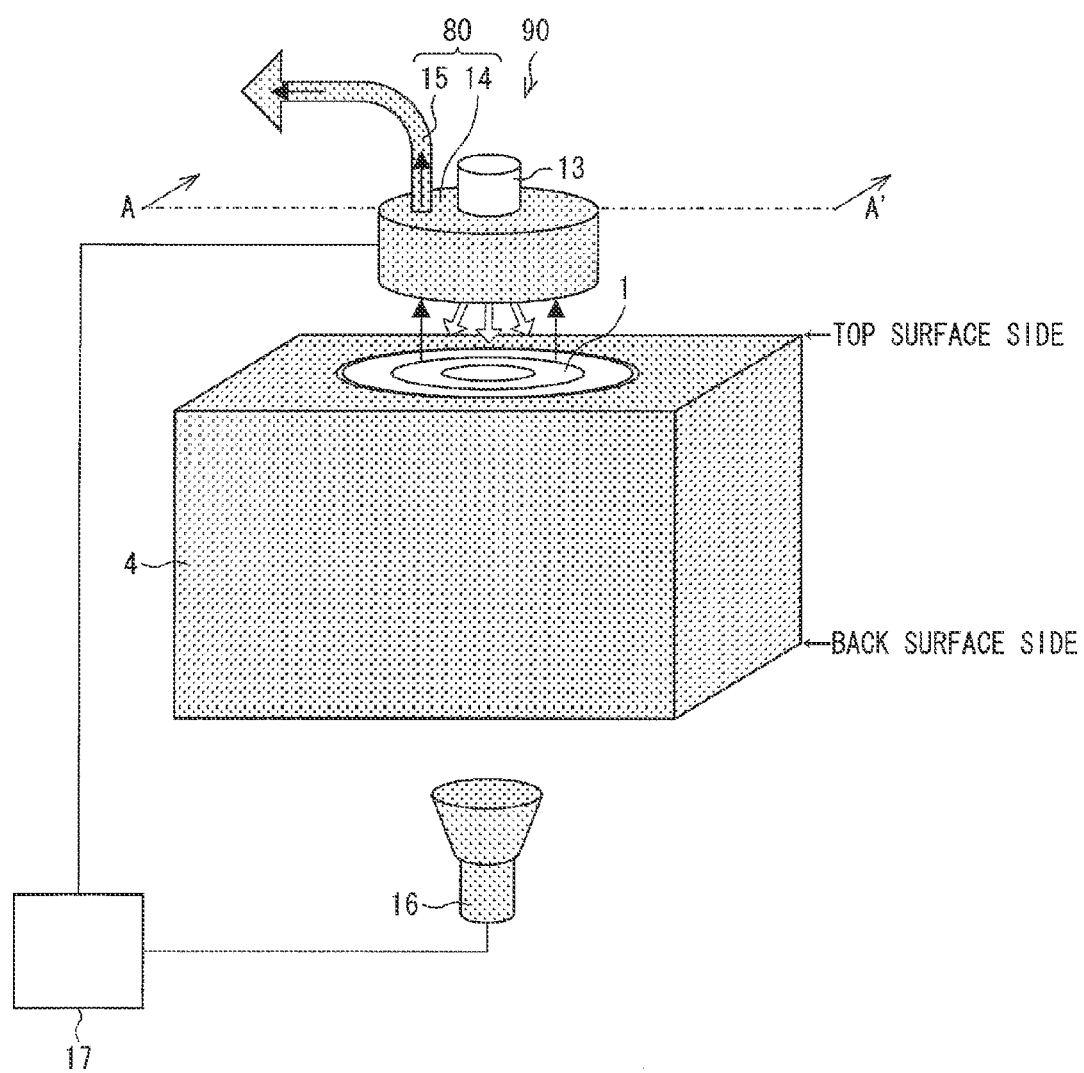
FIG. 7 is a side view illustrating a positional relationship among (i) a suction head including an LED illumination device and included in an optical conveying device of an embodiment of the present invention, (ii) the lens section (the actuator including the lens unit) included in the camera module illustrated in FIG. 1, and (iii) an image recognition camera unit included in the optical conveying device.
Figure 8:
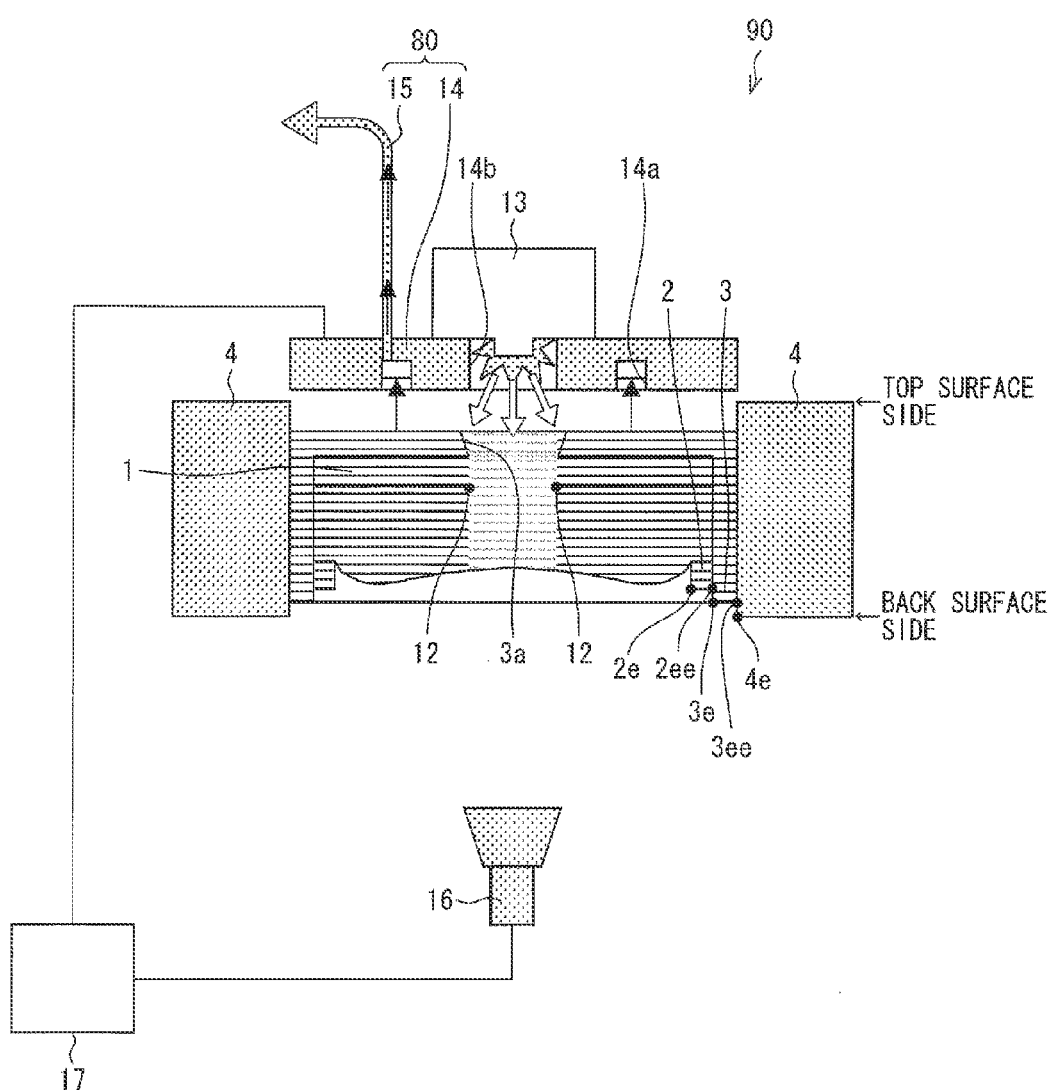
FIG. 8 is a cross-sectional view illustrating a positional relationship among (i) a suction head including an LED illumination device and included in an optical conveying device of an embodiment of the present invention, (ii) the lens section (the actuator including the lens unit) included in the camera module illustrated in FIG. 1, and (iii) an image recognition camera unit included in the optical conveying device.

FIG. 7 is a perspective view illustrating, together with the lens section 50, a configuration of the optical member conveying device 90 for moving (conveying) the lens section 50 so that the lens section 50 is aligned with the sensor section 60 (FIG. 5). FIG. 8 is a cross-sectional view, taken along a cutting line A-A' illustrated in FIG. 7, of the optical member conveying device 90. Note that FIGS. 7 and 8 each also illustrate the lens section 50 to be conveyed.

(Configuration of Optical Member Conveying Device 90)

As illustrated in FIG. 7, the optical member conveying device 90 of the present embodiment includes a lens unit suction unit 80, an image recognition camera unit 16, and a control section 17 (control section).

The lens unit suction unit 80 includes (i) a lens unit suction head 14 which (a) makes contact with a top surface of the lens unit 1 which top surface constitutes the top surface of the lens section 50 and (b) carries out a vacuum suction of the top surface of the lens unit 1, (ii) a small LED illumination device 13 included in the lens unit suction head 14, and (iii) a lens unit suction hose 15 which connects the lens unit suction head 14 to a suction device (not illustrated).

The lens unit suction head 14 has a contact surface which is to be in contact with the top surface of the lens barrel 3 which top surface constitutes the top surface of the lens unit 1. The contact surface has a plurality of suction holes 14a each of which communicates with the lens unit suction hose 15. In a case where the contact surface is brought into contact with the top surface of the lens barrel 3 and the suction device (not illustrated) is operated, the top surface of the lens barrel 3 is sucked through the plurality of suction holes 14a, so that the lens barrel 3 is combined with the lens unit suction head 14. In this state, when the lens unit suction head 14 is moved by a moving section (not illustrated), the lens section 50 is also moved together with the lens barrel 3. This enables to move (adjust) the lens section 50 so that the lens section 50 is located in a user's desired position and have a user's desired orientation.

Further, the lens unit suction head 14 has a through hole 14b in a position overlapping with the opening hole 3a of the lens barrel 3 while the contact surface is in contact with the top surface of the lens barrel 3. Light emitted from the small LED illumination device 13, which is provided on a surface of the lens unit suction head 14 opposite to the connection surface of the lens unit suction head (i.e., a top surface of the suction head 14) travels through the through hole 14b to the connection surface side of the lens unit suction head 14 (i.e., the back surface side of the lens unit suction head 14).

As described above, the small LED illumination device 13, which is provided on the top surface of the suction head 14, emits light from the top surface side toward the opening hole 3a of the lens barrel 3 of the lens unit 1 through the through hole 14b. Accordingly, the light travels from the opening hole 3a through the imaging lens 71 so as to be projected on the back surface side of the imaging lens 71. FIG. 8 illustrates an outer edge 12 of a region of light which is projected on the back surface side of the imaging lens 71. The outer edge 12 is identical to the outer edge 12 discussed with reference to FIG. 4. No particular structural limitation is imposed on the small LED illumination device 13, provided that the above configuration can be provided. According to the present embodiment, as illustrated in FIG. 8, a light emitting section of the small LED illumination device 13 is inserted into the through hole 14b. This allows light emitted from the light emitting section to enter the imaging lens 71 from the opening hole 3a without any light leakage.

Note that, in the present embodiment, the lens section 50 is held and moved by a chucking or suction device 23 illustrated in FIGS. 15, 16, 19, and 20, in addition to the lens unit suction head 14. The chucking or suction device 23 (i) makes contact with side surfaces (side surfaces of the actuator unit 4) of the lens section 50 and (ii) sandwiches or sucks the lens section 50 from both of the side surfaces of the lens section 50 so as to hold the lens section 50.

In the present embodiment, the optical member conveying device 90 can include, in addition to the lens unit suction head 14, a lens unit suction head 19 illustrated in FIGS. 11, 12, 17, and 18. The lens unit suction head 19 illustrated in FIGS. 11, 12, 17, and 18 is structurally different from the lens unit suction head 14 in size of a through hole and positional arrangement of a small LED illumination device (described later in detail). Structures other than these have been already discussed in the description on the lens unit suction head 14, and are thus not discussed repeatedly. The lens unit suction head 19 is used in tilt corrections described later.

Note that, in tilt corrections [3], [4], [5], and [6] described later, the lens unit suction head 19 is used instead of the lens unit suction head 14.

Accordingly, in a case where at least one of the tilt corrections [3], [4], [5], and [6] is carried out, it is necessary to (i) remove, from the lens unit 1, the lens unit suction head 14 which was used in image recognition that was carried out before the lens section 50 is temporarily mounted on the sensor section 60 and (ii) replace the lens unit suction head 14 with the lens unit suction head 19. Alternatively, instead of using the lens unit suction head 14, it is possible to use the lens unit suction head 19 for the image recognition that is carried out before the lens section 50 is temporarily mounted on the sensor section 60.

Figure 12:
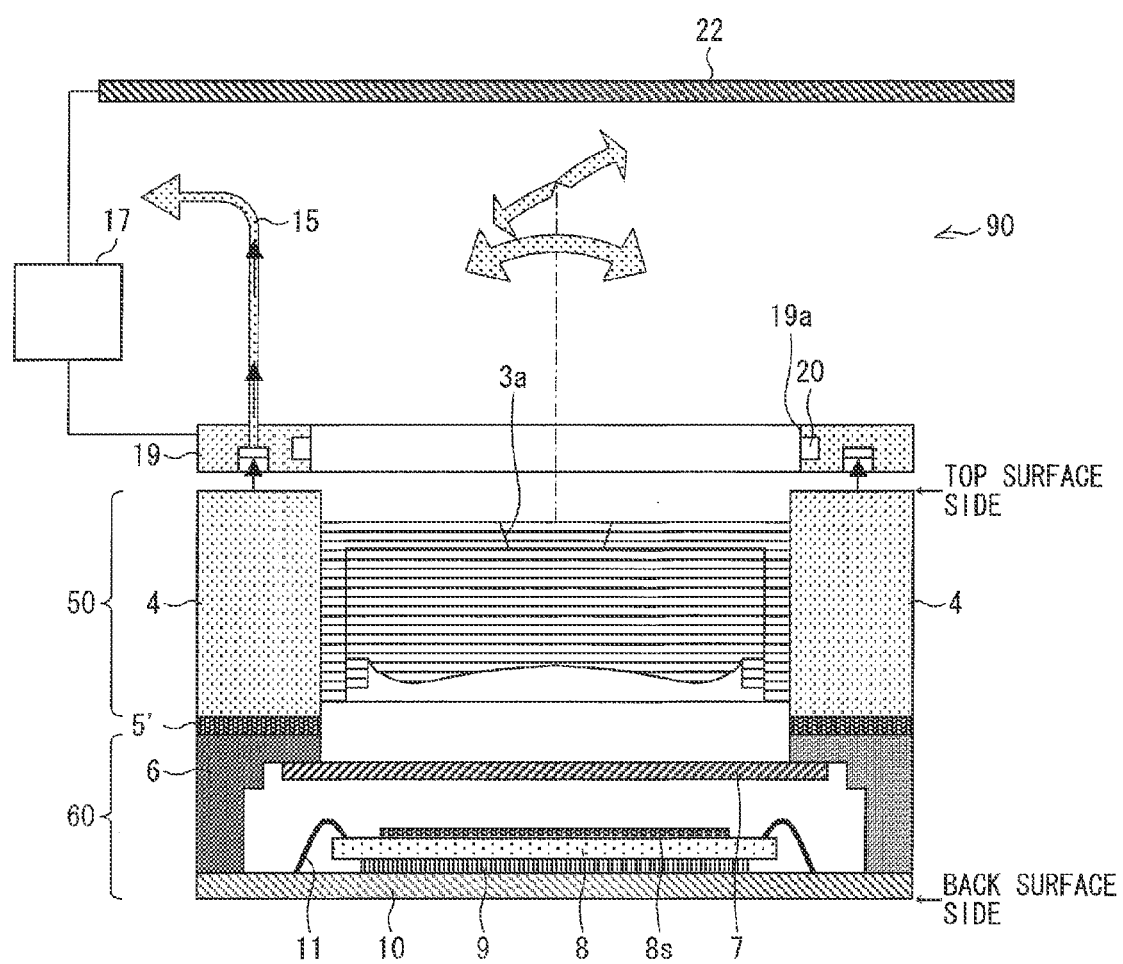
FIG. 12 is a cross-sectional view illustrating a positional relationship among (i) a suction head including an LED illumination device and included in an optical conveying device of an embodiment of the present invention, (ii) the lens section (the actuator including the lens unit) and the sensor section which are included in the camera module illustrated in FIG. 1, and (iii) a chart which is included in the optical conveying device.
Figure 18:
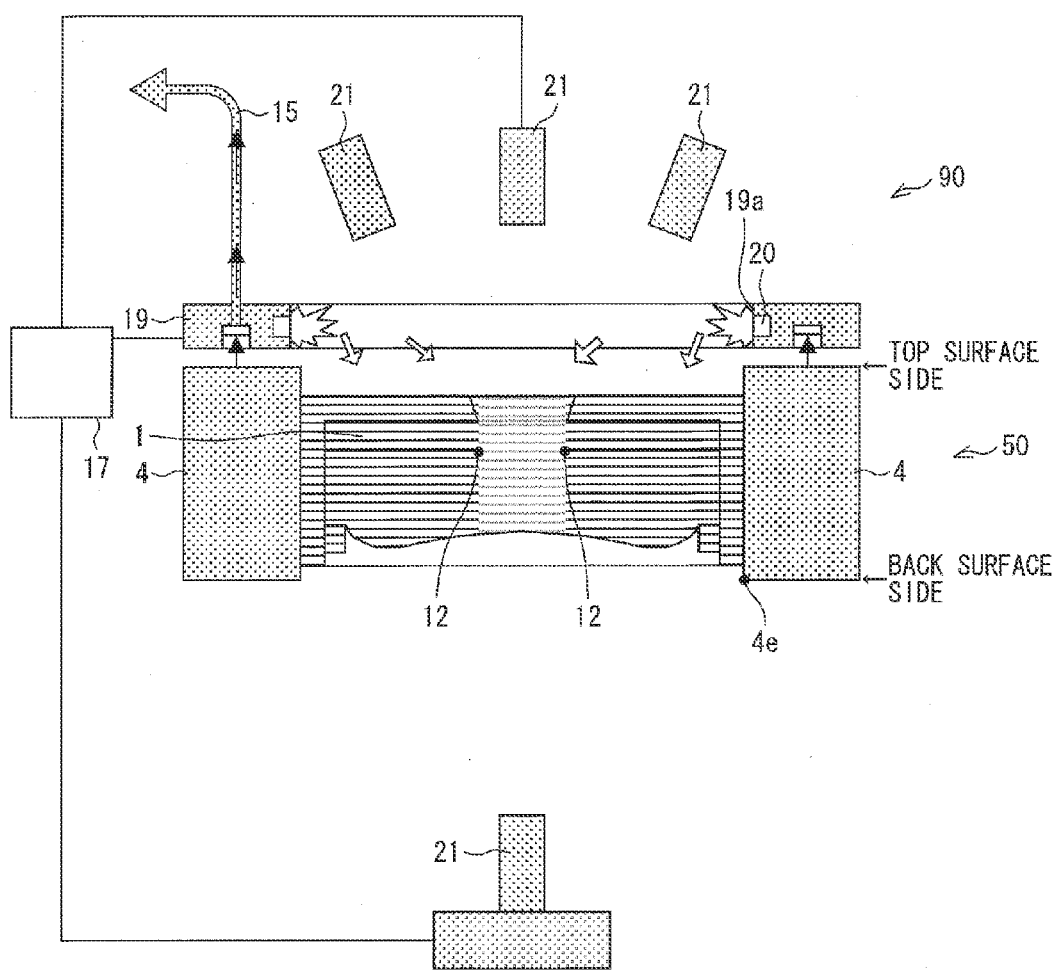
FIG. 18 is a cross-sectional view illustrating a positional relationship among (i) a suction head having an opening hole and an LED illumination device and included in an optical conveying device of an embodiment of the present invention, (ii) the lens section (the actuator including the lens unit) included in the camera module illustrated in FIG. 1, and (iii) an MTF measuring apparatus.

The lens unit suction head 19 illustrated in FIG. 18 has a through hole 19a that has a large diameter and (ii) does not interfere with image capturing (photographing) which is carried out by use of the imaging lens 71. Further, a small LED illumination device 20 is embedded in a ring-shaped wall surface constituting the through hole 19a. The small LED illumination device 20 functions in a similar manner to the small LED illumination device 13. The small LED illumination device 20 can have a ring shape or can be configured such that a plurality of small LEDs are arranged in a ring shape. Note that, as illustrated in FIGS. 12 and 18, the lens unit suction head 19 has suction holes in a region which is to be in contact with the top surface of the actuator unit 4.

The lens unit suction head 14, the lens unit suction head 19, and the chucking or suction device 23 are each capable of moving (including tilting) the lens section 50 in any direction.

The image recognition camera unit 16 is a camera unit for (i) receiving projection light emitted from the small LED illumination device 13 and having traveled through the opening hole 3a of the lens barrel 3 so as to be projected and (ii) carrying out image recognition of an edge of a projection image based on data obtained by carrying out a photoelectric conversion of the projection light thus received. Note here that the edge is defined by the opening hole 3a of the lens barrel 3 of the lens unit The control section 17 controls at least one of the lens unit suction head 14 and the chucking or suction device 23, each of which conveys the lens section 50, to mount, in accordance with the edge with respect to which the image recognition has been carried out by the image recognition camera unit 16, the lens section 50 in a user's desired position and orientation of the sensor section 60.

Note that also in the tilt correction described later, the control section 17 controls at least one of the lens unit suction head 14 and the chucking or suction device 23.

Similarly, while (i) the image recognition is also being carried out in the effective pixel area 8s of the imaging sensor chip 8 and (ii) the lens section 50 is being aligned with the effective pixel area 8s, the lens section 50 is arranged to be fixed to a top surface of the sensor section 60 to which the adhesive part 5 has been applied in advance.

A light region, which is defined by light which (i) is emitted from the small LED illumination device 13 and (ii) travels through the imaging lens 71, has the outer edge 12. An optical axis of the imaging lens 71 (i.e., a center XY position of the lens) is located within the outer edge 12, with respect to which the image recognition is carried out by the image recognition camera unit 16 and the effective pixel area 8s of the imaging sensor chip 8. Accordingly, the image recognition of the outer edge 12 enables to not only more clearly but more accurately include a center position of the optical axis within the outer edge 12, as compared with the image recognition of the edges 3e and 3ee of the lens barrel 3 or the edges 2e and 2ee of the retainer 2. That is, due to a structure in which (i) the imaging lens 71 is provided in the lens barrel 3, (ii) the retainer 2, as a lid, is placed over the lens barrel 3, and (iii) the lens barrel 3 is bonded and fixed to the retainer 2, a center of the lens barrel 3 and a center of the retainer 2 may not precisely coincide with a center of the imaging lens 71. However, a lens has an aperture diaphragm hole, which is a hole affecting a range that can be photographed, i.e., an angle of view. According to the present embodiment, it is possible to include a center position of the aperture diaphragm hole within the outer edge 12. This enables to most accurately include an optical axis within the outer edge 12.

Figure 10:
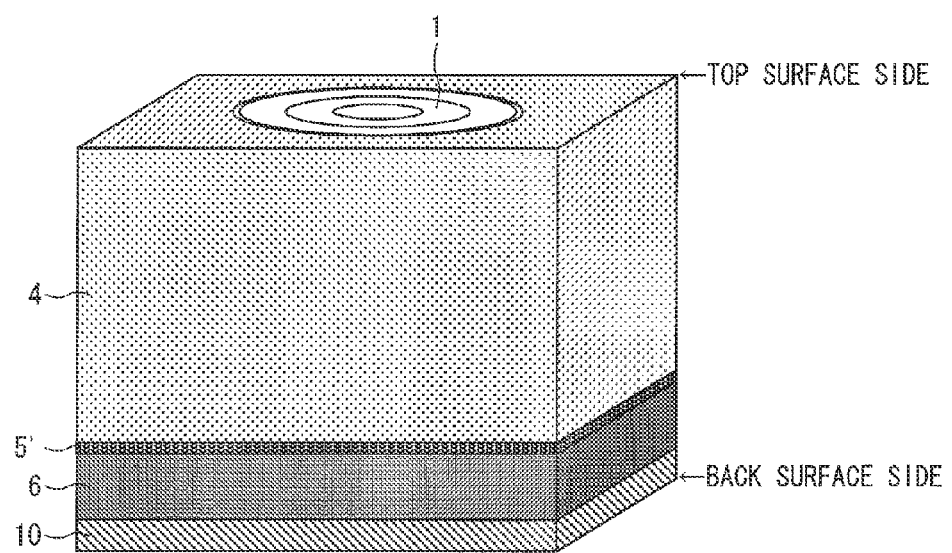
FIG. 10 is a perspective view illustrating a camera module in which a lens section, which is conveyed and aligned by an optical conveying device of an embodiment of the present invention, is temporarily mounted on a sensor section.

Note that the image recognition described above is carried out before the lens section 50 is temporarily mounted on the sensor section 60 as illustrated in FIG. 10.

Since the outer edge 12 which is projected by the small LED illumination device 13 is located near the top surface of the lens unit 1, a disadvantage may arise. That is, in a case where the lens unit suction head 14 is tilted, a positional displacement (X-Y positional displacement) of the actuator unit 4 in a direction vertical to the optical axis may be relatively large. In a case where (i) the image recognition of the lens unit 1 is carried out in a high position near the top surface, such as the opening hole 3a, of the lens unit 1 and (ii) the top surface of the lens unit 1 is sucked so as to hold the lens unit 1, a swing and tilt of the lens unit 1 easily affects the positional displacement (X-Y positional displacement) in the direction vertical to the optical axis. In the present embodiment, therefore, one or some of the following seven types of tilt corrections is carried out so as to overcome the above disadvantage. The lens section 50 is then bonded and fixed to the sensor section 60.

Figure 13:
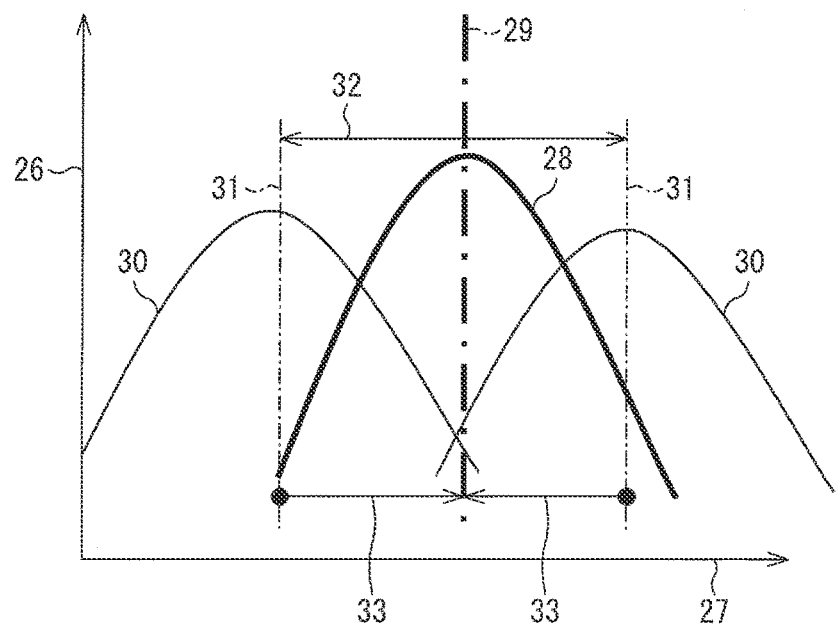
FIG. 13 is an explanatory diagram (graph) illustrating a characteristic of change in resolution or contrast performance and an MTF defocus characteristic (when a tilt occurs) which are checked in an embodiment in accordance with the present invention.
Figure 14:
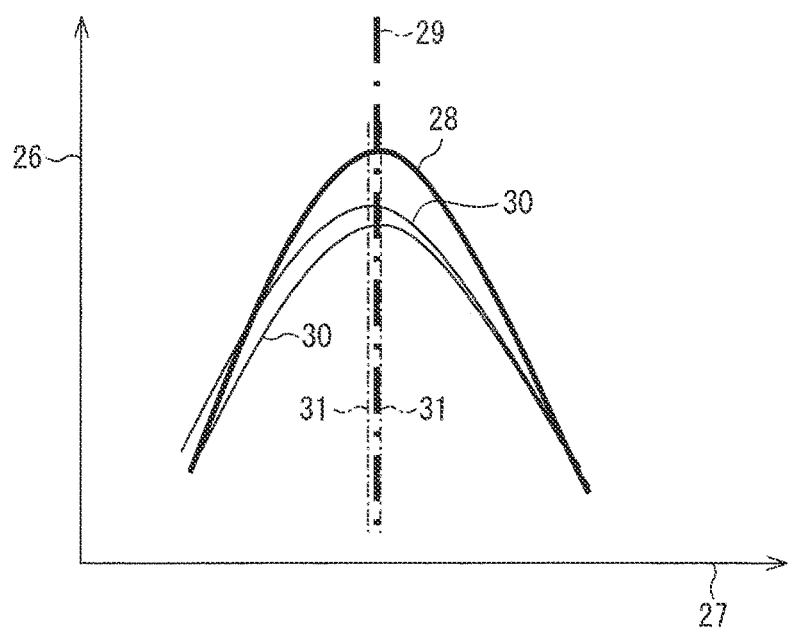
FIG. 14 is an explanatory diagram (graph) illustrating a characteristic of change in resolution or contrast performance and an MTF defocus characteristic (when a small tilt occurs) which are checked in an embodiment in accordance with the present invention.

Whether or not the lens unit suction head 14 is tilted can be determined by photographing the lens unit suction head 14 from the back surface side as illustrated in FIG. 8 by the image recognition camera unit 16. Specifically, it is possible to determine that the lens unit suction head 14 is tilted in a case where (i) the lens unit suction head 14 is photographed by the image recognition camera unit 16 and (ii) the inner edge 4e, which is circular as illustrated in FIG. 4, of the actuator unit 4 appears to be elliptical. Alternatively, it is possible to determine that the actuator unit 4 is tilted in a case where (i) the lens unit suction head 14 is photographed by the image recognition camera unit 16 and (ii) the outer edge 4ee, which is rectangular, of the actuator unit 4 appears to be trapezoidal. Alternatively, it is possible to determine that the actuator unit 4 is tilted in a case where a titling tendency is observed by use of a laser displacement gauge or a tilt measuring device. Alternatively, it is possible to determine that the actuator unit 4 is tilted in a case where a characteristic of change in resolution or contrast performance and an MTF defocus characteristic are each not as shown in FIG. 14 (described later) but as shown in FIG. 13 (described later).

In the present invention, tilt correction should be carried out in a case where a tilt state is checked and it is found that the tilt correction is necessary. Alternatively, the tilt correction should be carried out as needed after actual tilting stability of the optical member conveying device is checked. Note that which one (or ones) of the seven types of tilt corrections is to be carried out is determined in accordance with (i) a size, (ii) necessary production capacity, and (iii) a method of defining specifications of a camera module.

(Seven Types of Tilt Corrections)

Tilt correction [1]

Figure 19:
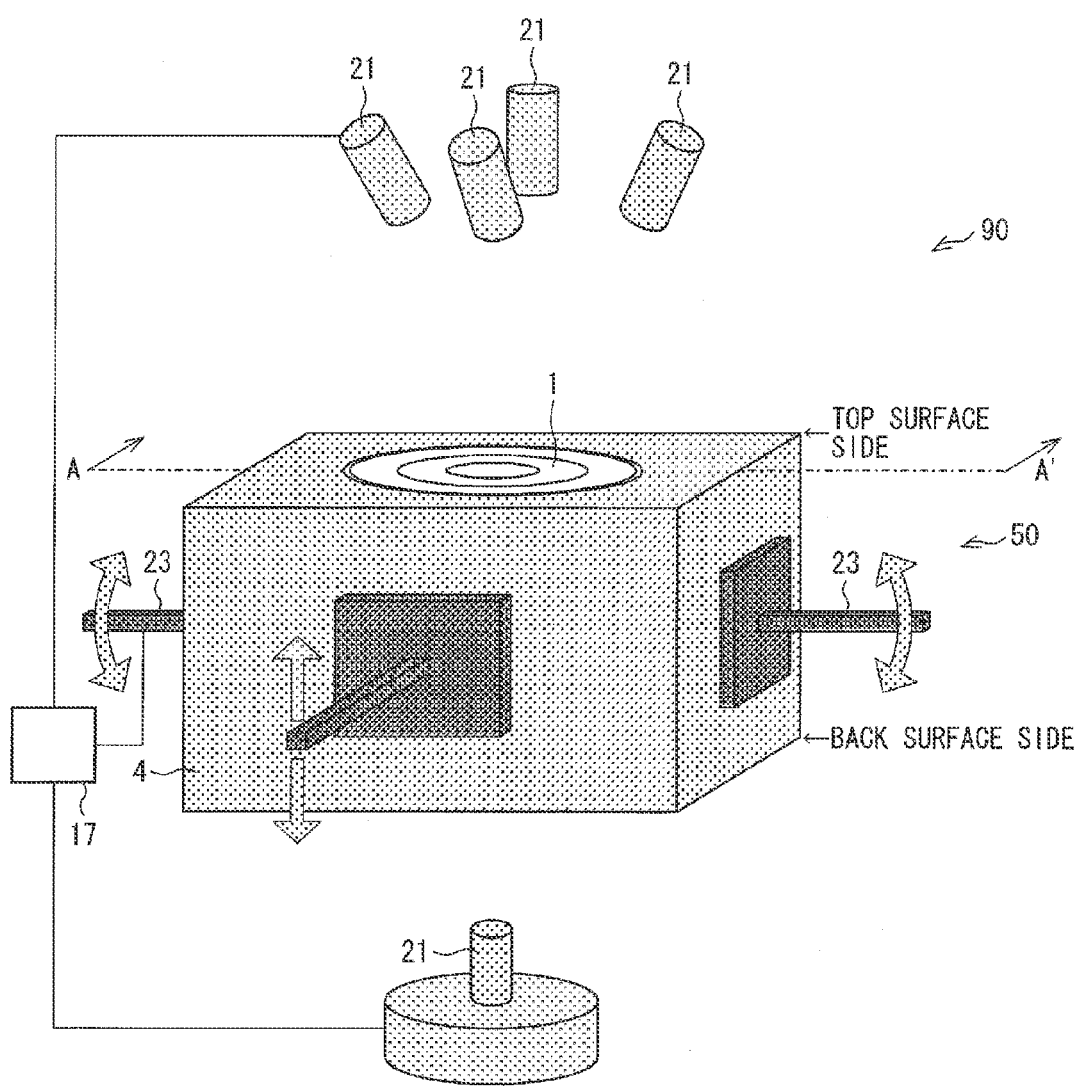
FIG. 19 is a perspective view illustrating a positional relationship among (i) a suction head including an LED illumination device and included in an optical conveying device of an embodiment of the present invention, (ii) the lens section (the actuator including the lens unit) and the sensor section which are included in the camera module illustrated in FIG. 1, and (iii) MTF measuring apparatuses and a chucking or suction device which are included in the optical conveying device.
Figure 20:
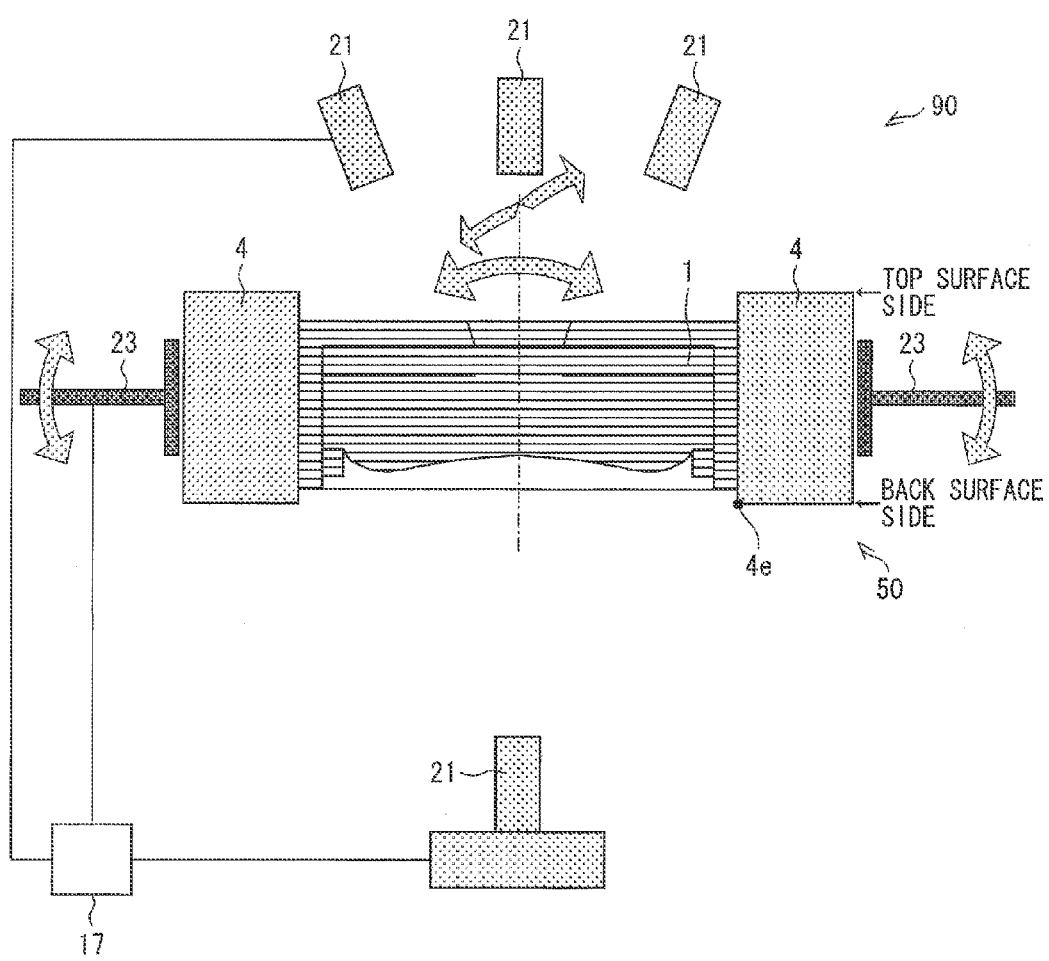
FIG. 20 is a cross-sectional view illustrating a positional relationship among (i) a suction head including an LED illumination device and included in an optical conveying device of an embodiment of the present invention, (ii) the lens section (the actuator including the lens unit) and the sensor section which are included in the camera module illustrated in FIG. 1, and (iii) MTF measuring apparatuses and a chucking or suction device which are included in the optical conveying device.

A state of a swing and tilt of the lens section 50 is measured on the basis of the fact that when the actuator unit 4, which is tilted, is photographed from the back surface side of the actuator unit 4 by the image recognition camera unit 16 as illustrated in FIG. 8, (i) the inner edge 4e, which is circular, of the actuator unit 4 appears to be elliptical or (ii) the outer edge 4ee, which is rectangular, of the actuator unit 4 appears to be trapezoidal. Then, a tilt correction is carried out by inclining the lens section 50 in a direction in which the tilt is cancelled. At the time when the tilt correction is completed, the lens section 50 is separated from the sensor section 60. The lens section 50 with respect to which the tilt correction has been carried out (i) is mounted on the sensor section 60 to which a resin is applied and (ii) is fixed by hardening the adhesive resin (by, for example, irradiating a UV curing resin with an ultraviolet ray). In this case, examples of methods of inclining the lens section 50 in a direction in which the tilt is cancelled encompass (i) a method of inclining the lens section 50 by moving the lens unit suction head 14 and (ii) a method of inclining the lens section 50 by moving the chucking or suction device 23, which holds the lens section 50 as illustrated in FIGS. 19 and 20 (described later).

Tilt Correction [2]

Figure 9:
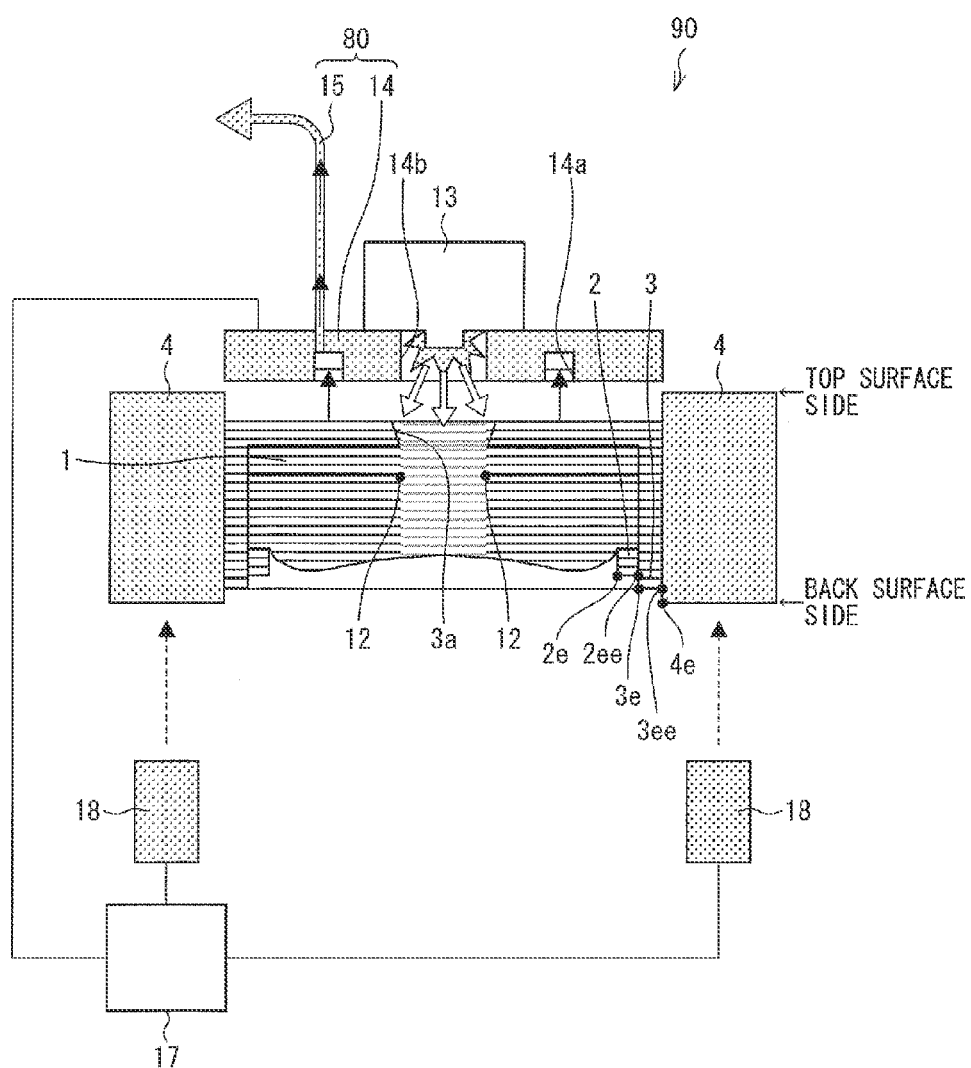
FIG. 9 is a cross-sectional view illustrating a positional relationship among (i) a suction head including an LED illumination device and included in an optical conveying device of an embodiment of the present invention, (ii) the lens section (the actuator including the lens unit) included in the camera module illustrated in FIG. 1, and (iii) a laser displacement gauge included in the optical conveying device.

The optical member conveying device 90 further includes a laser displacement gauge 18. As illustrated in FIG. 9, a distance to each of at least three positions on the back surface of the actuator unit 4 is measured by use of the laser displacement gauge 18 and a state of a swing and tilt of the lens section 50 is measured. Then, a tilt correction is carried out by inclining the lens section 50 in a direction in which the tilt is cancelled. At the time when the tilt correction is completed, the lens section 50 is separated from the sensor section 60. The lens section 50 with respect to which the tilt correction has been carried out (i) is mounted on the sensor section 60 to which a resin is applied and (ii) is fixed by hardening the adhesive resin (by, for example, irradiating a UV curing resin with an ultraviolet ray). The above-mentioned methods can be employed as a method of inclining the lens section 50 in a direction in which the tilt is cancelled.

Tilt Correction [3]

The optical member conveying device 90 further includes a chart 22 for checking a resolution or a contrast.

Figure 11:
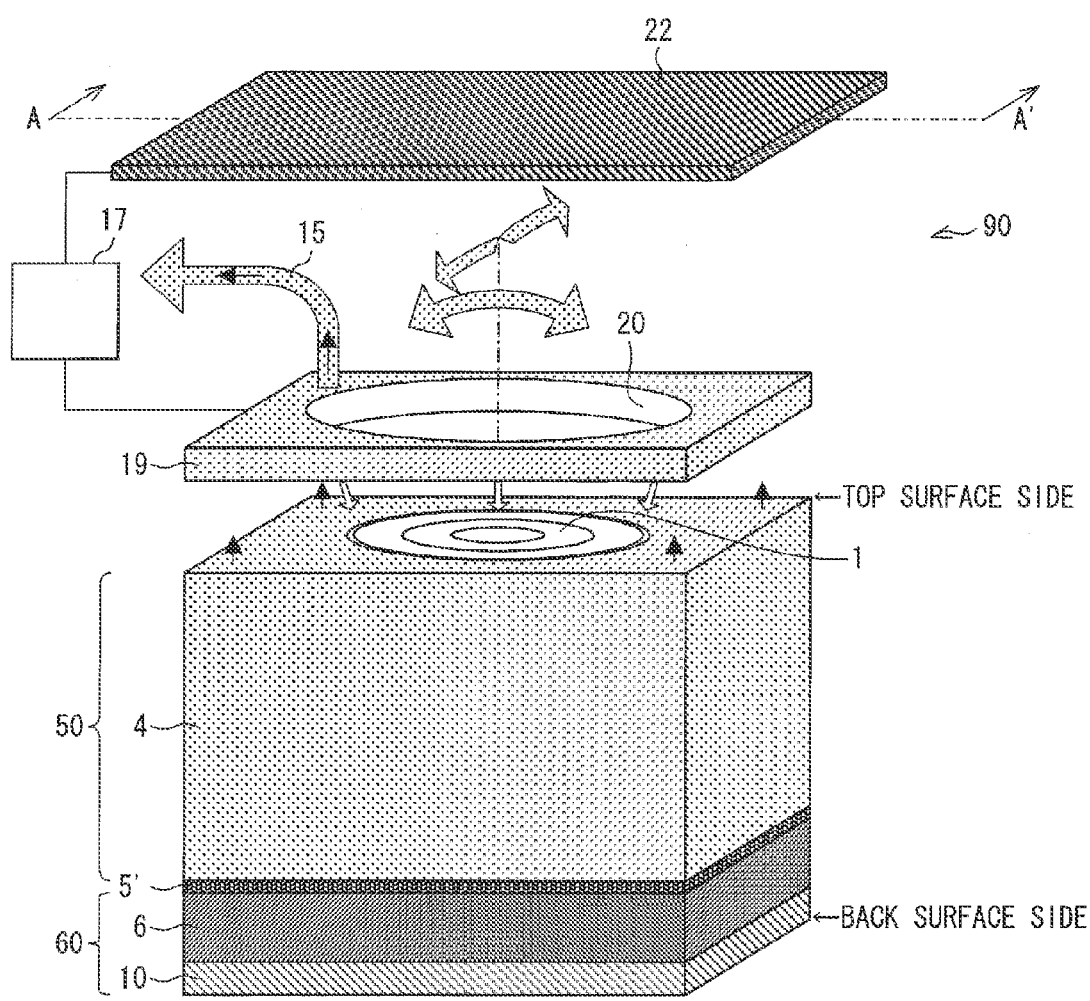
FIG. 11 is a perspective view illustrating a positional relationship among (i) a suction head including an LED illumination device and included in an optical conveying device of an embodiment of the present invention, (ii) the lens section (the actuator including the lens unit) and the sensor section which are included in the camera module illustrated in FIG. 1, and (iii) a chart included in the optical conveying device.

After the above image recognition is carried out, the lens section 50 is temporarily mounted on the sensor section 60 as illustrated in FIG. 10. At this point, an adhesive resin of an adhesive part 5' has not been hardened or applied. As illustrated in FIGS. 11 and 12, while being energized, the sensor section 60 captures, through a hole provided in a center part of the lens unit suction head 19 by use of the chart 22 provided on a top surface of the lens unit suction head 19, an image of a chart for checking a resolution or a contrast. Note that, at this point, the small LED illumination device 20 included in the lens unit suction head 19 is emitting no light.

Further, the lens section 50 and the lens unit suction head 19 are moved upward and downward or a movable part (lens barrel) in the lens section 50 is moved upward and downward, so that a distance between the lens section 50 and the sensor section changes. Then, a characteristic of change in resolution or contrast performance is compared between (i) an image center part (center position), which is a center of an image generated by the effective pixel area $8s$ and (ii) four or more positions in a peripheral part of the image center part.

Note here that a graph illustrated in FIG. 13 is a graph in which (i) a horizontal axis shows an amount of shift of a lens or a distance between a sensor and a lens indicated by a reference sign 27 and (ii) a vertical axis shows a resolution or contrast performance indicated by a reference sign 26. A reference sign 28 indicates a characteristic of the image center part, and a reference sign 29 indicates a peak position of the resolution characteristic of the image center part. Reference signs 30 indicate characteristics of the peripheral part. Reference signs 31 indicate peak positions of the resolution characteristics of the peripheral part. A reference sign 32 indicates a positional displacement amount of the peak position of the resolution characteristic between one position in the peripheral part and another position in the peripheral part. In a case where a resolution/contrast performance peak positional displacement amount 32 is large as illustrated in FIG. 13, a tilt is large. FIG. 14 illustrates, on the other hand, a characteristic of change in resolution or contrast performance in a case where a tilt is small. In a case where the tilt is small, a positional displacement amount of the peak of the characteristic of change in resolution characteristic is small between the center part and the peripheral part as illustrated in FIG. 14. In the tilt correction [3], therefore, in a case where the resolution/contrast performance peak positional displacement amount 32 exceeds a given value (e.g., 30 µm), the lens section 50 is fixed to the sensor section 60 in the following manner. That is, a tilt correction is carried out by moving the lens unit suction head 19 so that (i) the center part is identical, in peak position of the resolution or contrast performance, to the four or more positions in the peripheral part and (ii) the positional displacement amount of the peak position of the resolution or contrast performance is small between the center part and the peripheral part. In this state, the lens section 50 is fixed to the sensor section 60. When the tilt correction is carried out, the peak positions of the resolution characteristics of the peripheral part are shifted in directions indicated by respective reference signs 33 in FIG. 13

Tilt correction [4]

Figure 15:
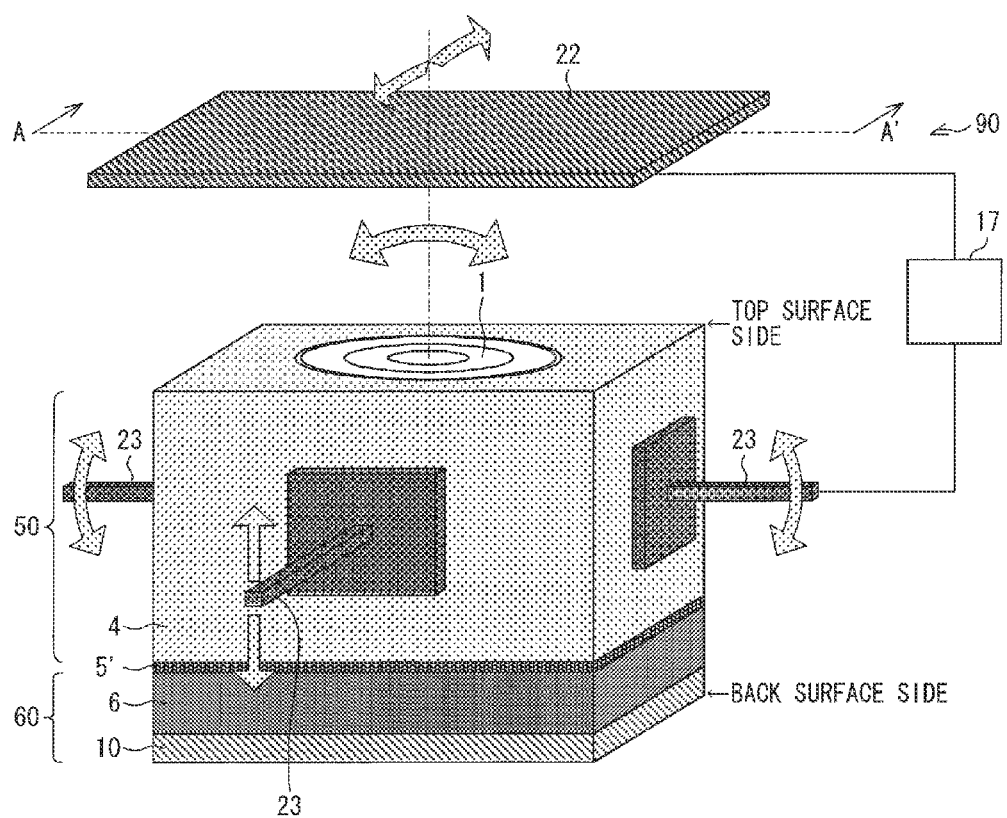
FIG. 15 is a perspective view illustrating a positional relationship among (i) a suction head including an LED illumination device and included in an optical conveying device of an embodiment of the present invention, (ii) the lens section (the actuator including the lens unit) and the sensor section which are included in the camera module illustrated in FIG. 1, and (iii) a chart and a chucking or suction device which are included in the optical conveying device.
Figure 16:
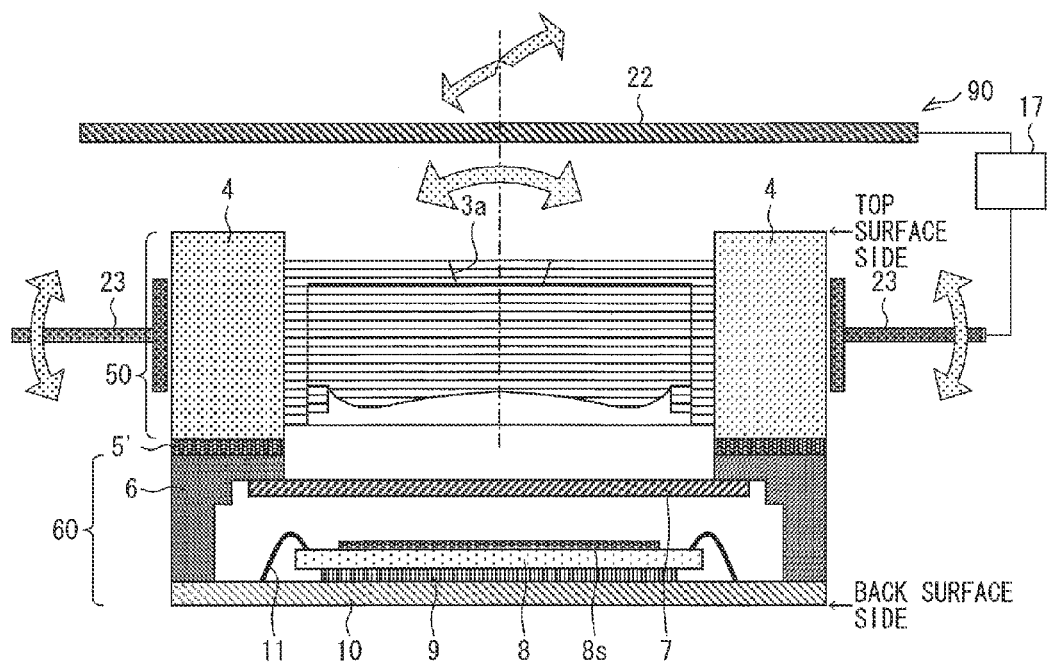
FIG. 16 is a cross-sectional view illustrating a positional relationship among (i) a suction head including an LED illumination device and included in an optical conveying device of an embodiment of the present invention, (ii) the lens section (the actuator including the lens unit) and the sensor section which are included in the camera module illustrated in FIG. 1, and (iii) a chart and a chucking or suction device which are included in the optical conveying device.

While being energized, the sensor section 60, on which the lens section 50 is temporarily mounted as illustrated in FIG. 11 or 15, captures an image of a chart for checking a resolution or a contrast by use of the chart 22 provided on the top surface side of the lens section 50 as illustrated in FIGS. 15 and 16. In this case, (i) the lens section 50 and (ii) the lens unit suction head 19 or the lens unit chucking or suction head 23 are moved upward and downward or a movable part (lens barrel) in the lens section is moved upward and downward, so that a distance between the lens section 50 and the sensor section 60 changes. Then, a characteristic of change in resolution or contrast performance is compared between (i) an image center part (center position), which is a center of an image generated by the effective pixel area 8s and (ii) four or more positions in a peripheral part of the image center part. In a case where the resolution/contrast performance peak positional displacement amount 32 exceeds a given value as illustrated in FIG. 13, a tilt is large. Accordingly, the lens section 50 is fixed to the sensor section 60 in the following manner. That is, the tilt correction is carried out by moving the chucking or suction device 23 so that the image center part is identical, in peak position of the resolution or contrast performance, to the four or more positions in the peripheral part. In this state, the lens section 50 is fixed to the sensor section 60.

Tilt correction [5]

The optical member conveying device 90 further includes a plurality of modulation transfer function (hereinafter referred to as "MTF") measuring apparatuses 21.

Figure 17:
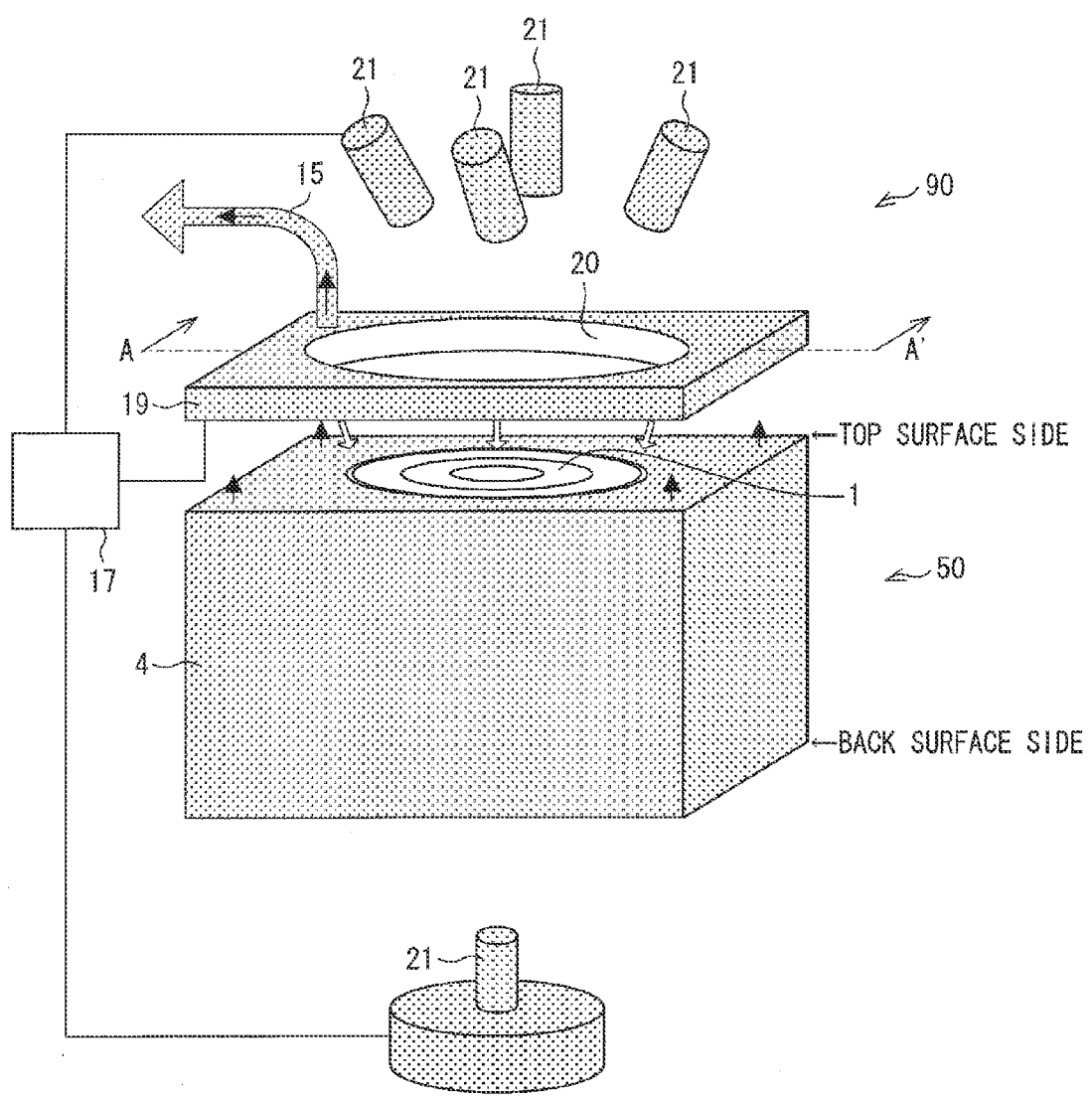
FIG. 17 is a perspective view illustrating a positional relationship among (i) a suction head having an opening hole and an LED illumination device included in an optical conveying device of an embodiment of the present invention, (ii) the lens section (the actuator including the lens unit) included in the camera module illustrated in FIG. 1, and (iii) an MTF measuring apparatus.

In order to carry out the tilt correction [5], an examination of an MTF defocus characteristic of the lens section 50 is carried out while the lens section 50 is being sucked by the lens unit suction head 19 as illustrated in FIGS. 17 and 18. The above examination is carried out, through a large through hole 19a provided in the center part of the lens unit suction head 19, by use of (i) a plurality of MTF measuring apparatuses 21 provided on a top surface side of the lens unit suction head 19 and (ii) an MTF measuring apparatus 21 provided on a back surface side of the lens section 50. Then, a defocus characteristic (characteristic of change in resolution or contrast performance) is compared between (i) a center part (center position) of the opening hole 3a and (ii) four or more positions in a peripheral part of the center part. An edge of a line (formed by irradiating the MTF measuring apparatus 21 on the back surface side of the lens section 50) which is projected on the MTF measuring apparatus 21 provided on the back surface side of the lens section is read by a plurality of cameras of the respective plurality of MTF measuring apparatuses provided on the top surface side of the lens section 50.

Results of the comparisons are mostly similar to those shown in the graphs illustrated in FIGS. 13 and 14. In a case where the resolution/contrast performance peak positional displacement amount 32 exceeds a given value as illustrated in FIG. 13, (i) a peak of the characteristic of change in resolution or contrast performance in one position in the peripheral part and (ii) a peak of the characteristic of change in resolution or contrast performance in another position in the peripheral part are displaced in opposite directions from a peak of the characteristic of change in resolution or contrast performance in the center part.

Accordingly, the lens section 50 is fixed to the sensor section 60 in the following manner. That is, the tilt correction is carried out by moving the lens unit suction head 19 so that the center part are identical, in peak position of the resolution or contrast performance, to the four or more positions in the peripheral part. In this state, the lens section 50 is fixed to the sensor section 60

Tilt correction [6]

In the tilt correction [6], an examination of an MTF defocus characteristic of the lens section 50 is carried out while the lens section 50 is being held by the chucking or suction device 23 as illustrated in FIGS. 19 and 20. The above examination is carried out by use of (i) a plurality of MTF measuring apparatuses 21 provided on a top surface side of the lens section 50 and (ii) an MTF measuring apparatus provided on a back surface side of the lens section 50. Then, a defocus characteristic (characteristic of change in resolution or contrast performance) is compared between (i) a center part (center position) of the opening hole 3a and (ii) four or more positions in a peripheral part of the center part.

Results of the comparisons are mostly similar to those shown in the graphs illustrated in FIGS. 13 and 14. In a case where the resolution/contrast performance peak positional displacement amount 32 exceeds a given value as illustrated in FIG. 13, (i) a peak of the characteristic of change in resolution or contrast performance in one position in the peripheral part and (ii) a peak of the characteristic of change in resolution or contrast performance in another position in the peripheral part are displaced in opposite directions from a peak of the characteristic of change in resolution or contrast performance in the center part.

Accordingly, the lens section 50 is fixed to the sensor section 60 in the following manner. That is, the tilt correction is carried out by moving the chucking or suction device 23 so that the center part are identical, in peak position of the resolution or contrast performance, to the four or more positions in the peripheral part. In this state, the lens section 50 is fixed to the sensor section 60.

Tilt correction [7]

Figure 21:
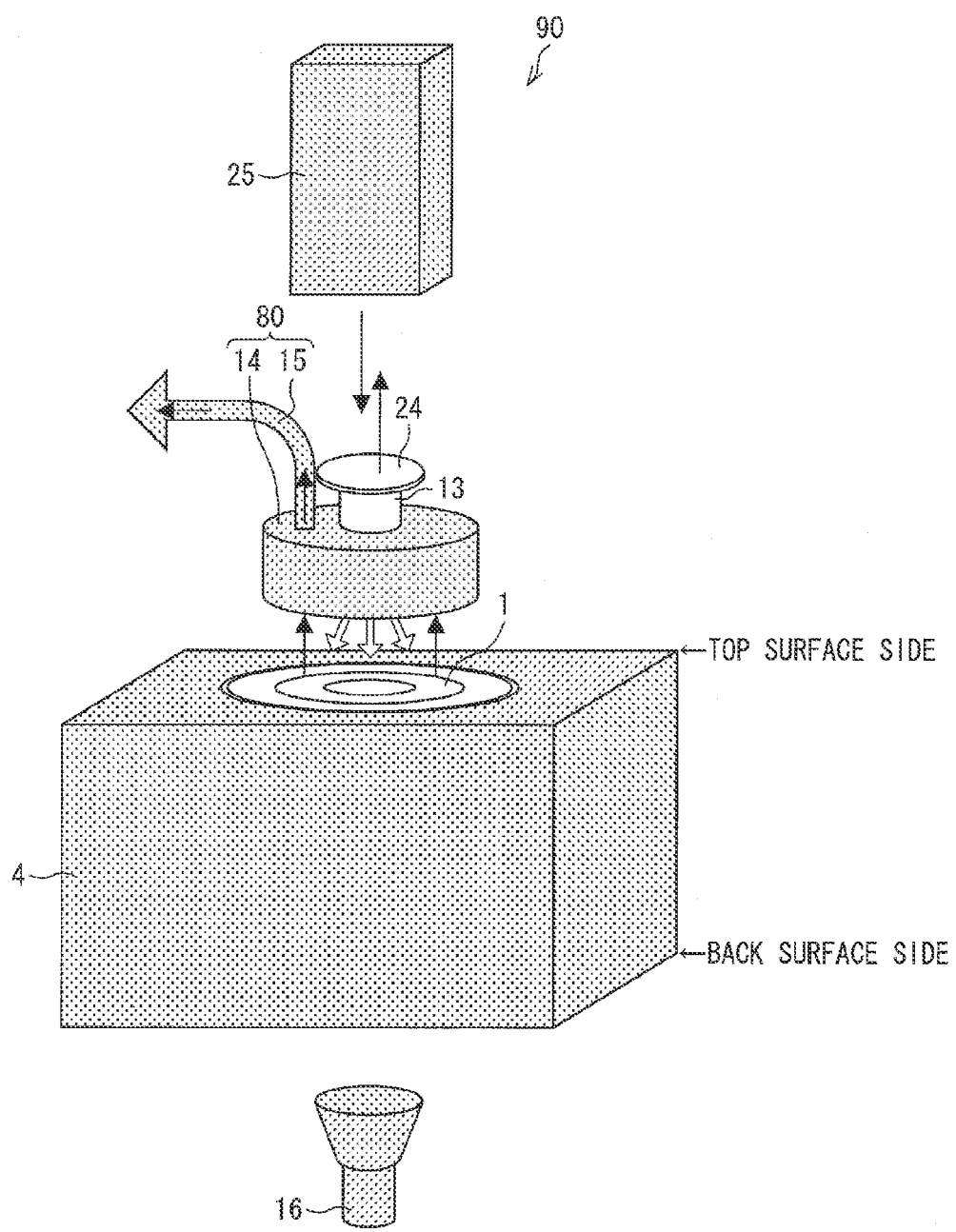
FIG. 21 is a perspective view illustrating a positional relationship among (i) a suction head including an LED illumination device and included in an optical conveying device of an embodiment of the present invention, (ii) the lens section (the actuator including the lens unit) included in the camera module illustrated in FIG. 1, and (iii) a tilt measuring device included in the optical conveying device.
Figure 22:
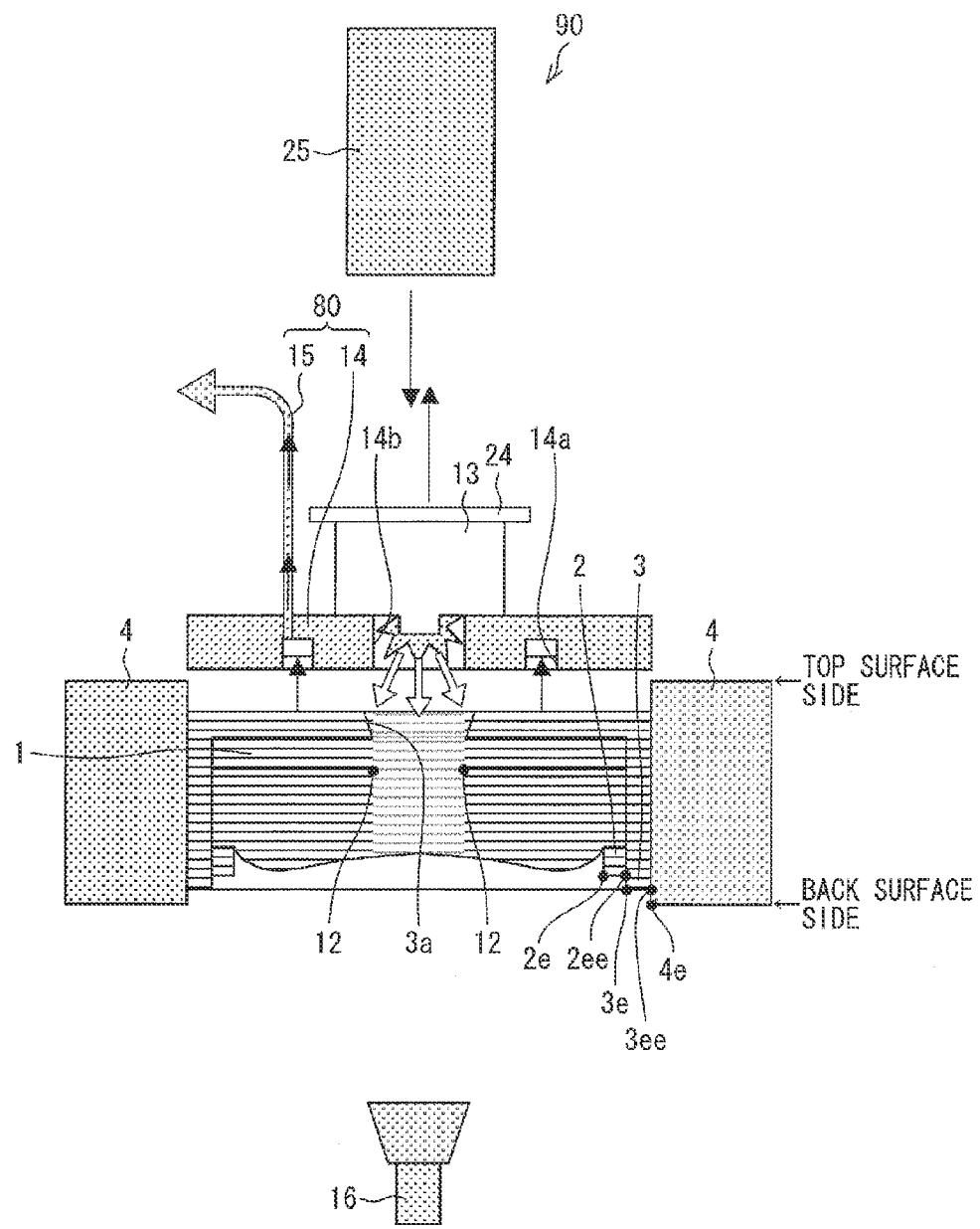
FIG. 22 is a cross-sectional view illustrating a positional relationship among (i) a suction head including an LED illumination device and included in an optical conveying device of an embodiment of the present invention, (ii) the lens section (the actuator including the lens unit) included in the camera module illustrated in FIG. 1, and (iii) a tilt measuring device included in the optical conveying device.
Figure 23:
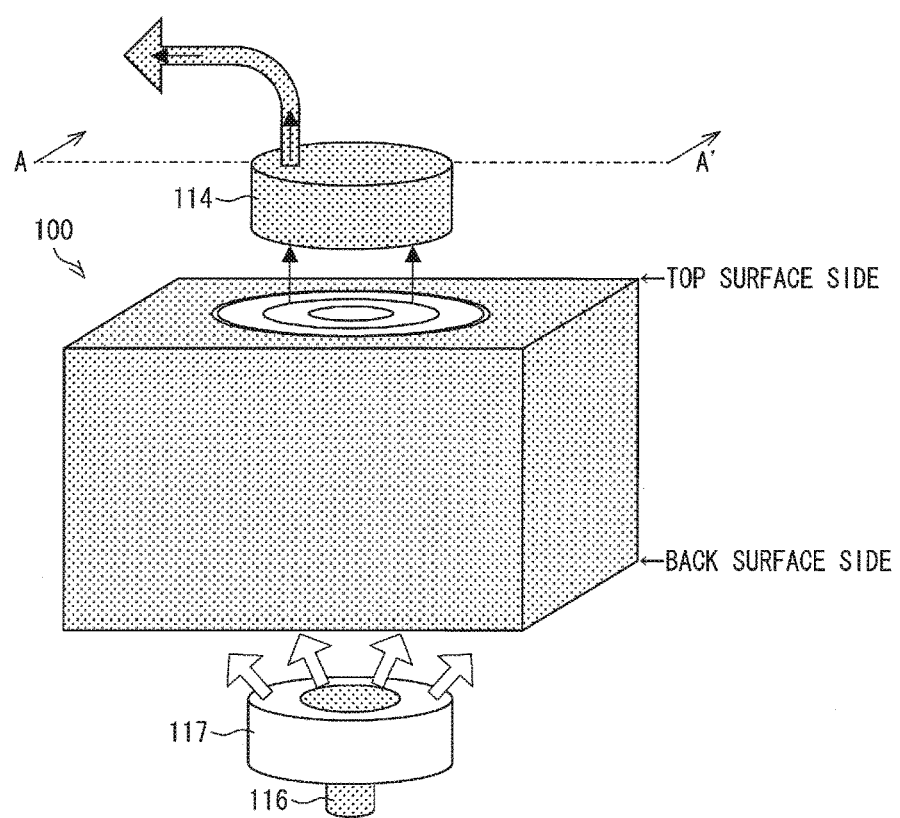
FIG. 23 is a view illustrating a conventional example.
Figure 24:
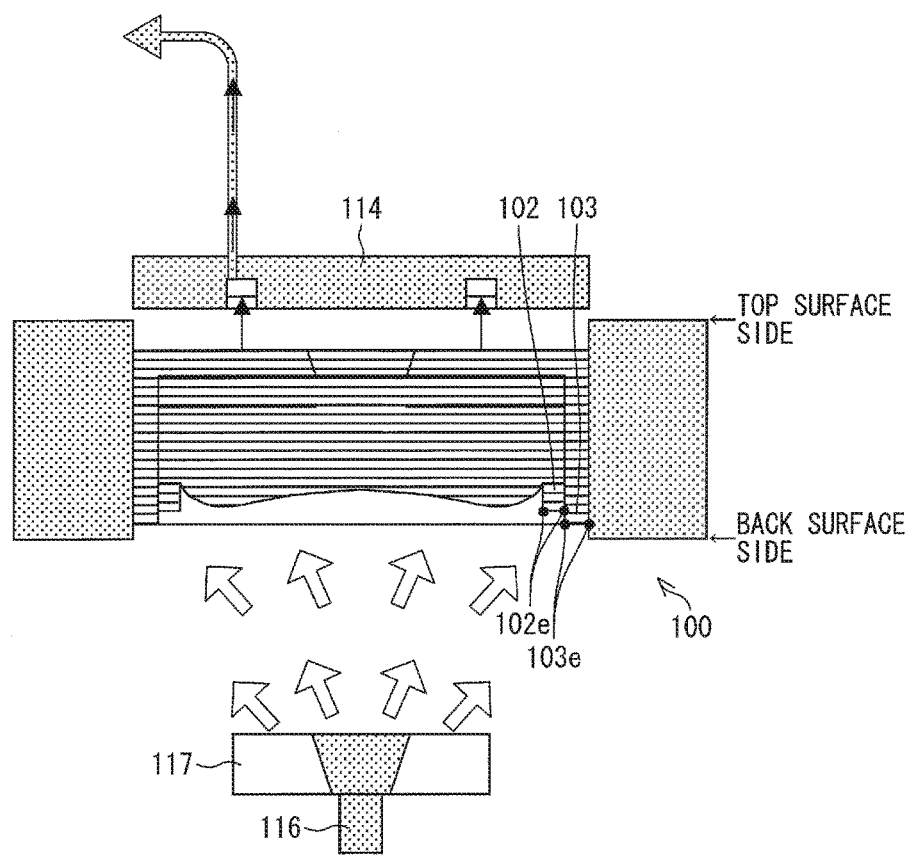
FIG. 24 is a view illustrating a conventional example.
Figure 25:
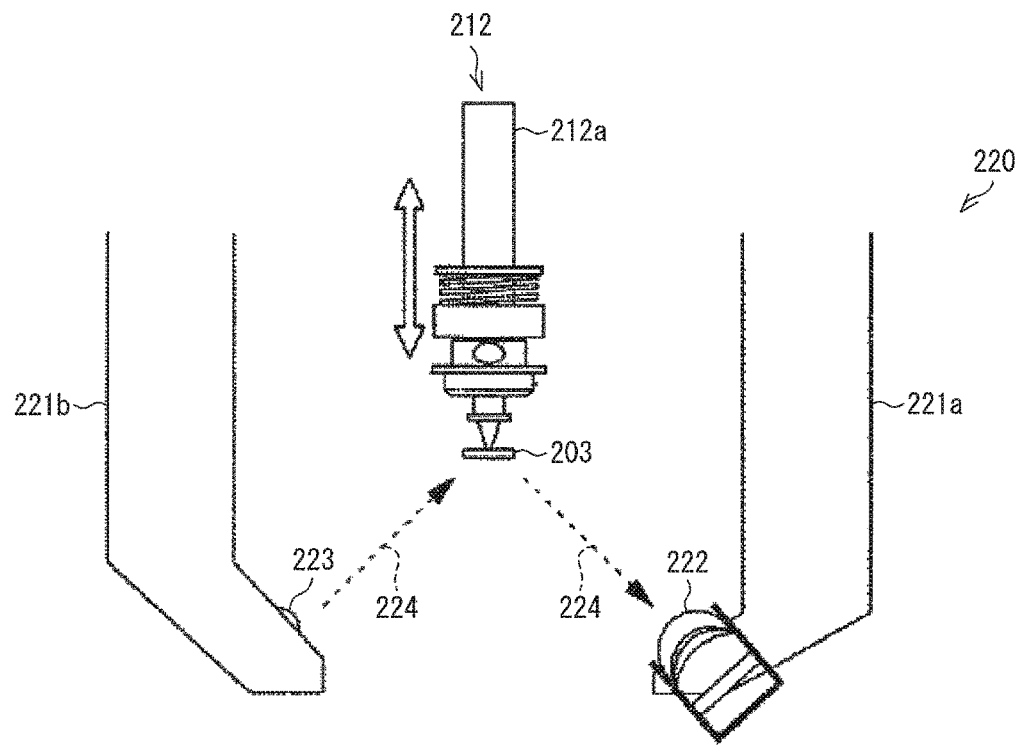
FIG. 25 is a view illustrating a conventional example.

The optical member conveying device 90 further includes a tilt measuring device 25. As illustrated in FIGS. 21 and 22, a mirror 24 is provided above the suction head 14 or the LED illumination device 13. A laser of the tilt measuring device is applied to the mirror and a tilt is measured. Further, a state of a swing and tilt of the lens section 50 is measured, and the lens section 50 is tilted in a direction in which the tilt is canceled. The lens section 50, with respect to which the tilt correction has been carried out, is fixed to the sensor section 60. The above-mentioned methods can be employed as a method of inclining the lens section 50 in a direction in which the tilt is cancelled.

[Conclusion]

An optical member conveying device in accordance with the present invention is an optical member conveying device (optical member conveying device 90) which (i) conveys, to a given position on a side, from which light enters, of a sensor section (sensor section 60) including a photoelectric conversion section (imaging sensor chip 8, effective pixel area 8s), an optical member (lens section 50) into which a lens (imaging lens 71) is incorporated and (ii) aligns the optical member (lens section 50) with the given position of the sensor section (sensor section 60), including: a holding section including at least one of (i) an adhesion head (lens unit suction head 14, 19) that changes a position and an orientation of the optical member (lens section 50) while (a) adhering to a top surface of the optical member (lens section 50) which top surface is an outer surface on a side, from which light enters, of the optical member (lens section 50) and (b) holding the optical member (lens section 50) and (ii) a chucking or suction device (chucking or suction device 23) that changes the position and the orientation of the optical member (lens section 50) while (a) making contact with a side surface of the optical member (lens section 50) which side surface is adjacent to the top surface and (b) holding the optical member (lens section 50); and a control section (control section 17) which controls the holding section, i.e., at least one of (i) the suction head (lens unit suction head 14, 19) and (ii) the chucking or suction device (chucking or suction device 23) to mount, in accordance with a projection image, the optical member (lens section 50) in the given position of the sensor section (sensor section 60) while (i) the holding section is holding the optical member and (ii) a light emitting element (small LED illumination device 13, 20) which emits light from above the top surface of the optical member (lens section 50) toward an opening hole (opening hole 3a of lens barrel 3) (a) from which light enters and (b) which is provided on the top surface of the optical member (lens section 50) is provided, the projection image being obtained by projecting, by use of light which is emitted from the light emitting element (small LED illumination device 13, 20), the opening hole (opening hole 3a of lens barrel 3) on a side of a back surface which side is opposite to a side of the top surface of the optical member (lens section 50).

With the configuration, the light emitting element is included in the suction head on the side of the top surface of the lens. This allows image recognition of an edge of the lens opening hole by a method of emitting the light from the top surface of the lens unit while the top surface of the lens unit is being sucked. Accordingly, the image recognition can be carried out in accordance with a more accurate position of the optical axis by the above method. This can eliminate limitations on reducing a size of a camera module. Further, this increases (i) a region in which a lens barrel cylindrical section can be invisible when viewed from a back surface of a lens section and (ii) a region in which a resin can be applied to an edge of the back surface of the lens section. Even in a case where a tilt is occurring in the lens section, the tilt can be corrected before the lens section is mounted on the sensor section. This reduces a performance management value of a member. Accordingly, it is possible to reduce a cost and make full use of various products.

In addition to the above configuration, an embodiment of the optical member conveying device in accordance with the present invention is preferably configured such that: the optical member (lens section 50) includes a lens barrel (lens barrel 3) (i) which (a) has a cylindrical shape and (b) stores the lens (imaging lens 71) and (ii) whose back surface (inner edge 3e, outer edge 3ee) has a shape that is circular when viewed from a side of the back surface which is opposite to the side of the top surface of the optical member (lens section 50); and a case where image recognition of the back surface (inner edge 3e, outer edge 3ee) of the lens barrel (lens barrel 3) carried out in accordance with the projection image detects that the back surface has changed in shape from circular to elliptical due to a swing and tilt of the optical member (lens section 50), the control section (control section 17) controls at least one of (i) the adhesion head (lens unit suction head 14, 19) and (ii) the chucking or suction device (chucking or suction device 23) to change the position and the orientation of the optical member (lens section 50) so that the swing and tilt of the optical member is corrected. With the configuration, even in a case where the above method of carrying out image recognition increases an amount of the positional displacement (X-Y positional displacement) which occurs in a direction vertical to an optical axis due to a tilt of the suction head and a tilt of the chucking or suction device, the swing and tilt of the optical member is corrected so that the positional displacement can be improved.

In addition to the above configuration, an embodiment of the optical member conveying device in accordance with the present invention is preferably configured such that: when viewed from the side of the back surface of the optical member (lens section 50), the optical member (lens section 50) (i) has a rectangular outer peripheral edge (outer edge 4ee of actuator unit) and (ii) includes a member (retainer 2, lens barrel 3) having a circular edge that is closer to a center of the optical member than the outer peripheral edge (outer edge 4ee of actuator unit) is; and (i) in a case where image recognition of the outer peripheral edge (outer edge 4ee of actuator unit) carried out from the side of the back surface of the optical member (lens section 50) in accordance with the projection image detects that the rectangular outer peripheral edge (outer edge 4ee of actuator unit) has changed in shape from rectangular to trapezoidal due to a swing and tilt of the optical member (lens section 50) or (ii) in a case where image recognition of the circular edge (outer edge or inner edge of retainer 2 or lens barrel 3) carried out from the side of the back surface of the optical member in accordance with the projection image detects that the circular edge has changed in shape from circular to elliptical due to a swing and tilt of the optical member (lens section 50), the control section (control section 17) controlling at least one of (i) the adhesion head (lens unit suction head 14, 19) and (ii) the chucking or suction device (chucking or suction device 23) to change the position and the orientation of the optical member (lens section 50) so that a tilt is corrected.

With the configuration, even in a case where the above method of carrying out image recognition increases an amount of the positional displacement (X-Y positional displacement) which occurs in a direction vertical to an optical axis due to a tilt of the suction head and a tilt of the chucking or suction device, the positional displacement can be improved by the tilt correction which is carried out through the image recognition.

In addition to the above configuration, an embodiment of the optical member conveying device (optical member conveying device 90) in accordance with the present invention is preferably configured to further include a laser displacement gauge (laser displacement gauge 18) which (i) applies, on the side of the back surface of the optical member (lens section 50), lasers to respective at least three positions which are located in an identical plane vertical to an optical axis of the optical member (lens section 50) and (ii) measures a distance to each of the at least three positions, the optical member including an actuator unit (actuator unit 4), the control section (control section 17) controlling the at least one of (i) the adhesion head (lens unit suction head 14, 19) and (ii) the chucking or suction device (chucking or suction device 23) to change the position and the orientation of the optical member (lens section 50) so that a swing and tilt of the optical member (lens section 50), which swing and tilt is measured on the basis of measurement results obtained by the laser displacement gauge (laser displacement gauge 18), is corrected.

With the configuration, even in a case where the above method of carrying out image recognition increases an amount of the positional displacement (X-Y positional displacement) which occurs in a direction vertical to an optical axis due to a tilt of the suction head and a tilt of the chucking or suction device, the positional displacement can be improved by the tilt measurement correction which is carried out by use of the laser displacement gauge.

In addition to the above configuration, an embodiment of the optical member conveying device (optical member conveying device 90) in accordance with the present invention is preferably configured to further include a chart (chart 22) for checking a resolution or a contrast by use of which chart a resolution or a contrast is checked by the photoelectric conversion section (imaging sensor chip 8, effective pixel area 8s), the adhesion head (lens unit suction head 14, 19) having a through hole (through hole 14b, 19a) which is concentric with the opening hole, the chart (chart 22) for checking a resolution or a contrast being provided on a side opposite to a side of the opening hole (opening hole 3a) across the through hole (through hole 14b, 19a), while the photoelectric conversion section (imaging sensor chip 8, effective pixel area 8s) of the sensor section (sensor section 60) is operating, the control section (control section 17) controlling at least one of (i) the suction head (lens unit suction head 14, 19) and (ii) the chucking or suction device (chucking or suction device 23) to change a distance from the optical member (lens section 50), which is temporarily mounted on the sensor section (sensor section 60), to the photoelectric conversion section (imaging sensor chip 8, effective pixel area 8s), while the distance is changing, the chart (chart 22) for checking a resolution or a contrast being used to obtain, through the through hole (through hole 14b, 19a), (i) a resolution or a contrast of a center position of the photoelectric conversion section (imaging sensor chip 8, effective pixel area 8s) and (ii) a resolution or a contrast of each of at least four positions in a peripheral part of the center position, in a case where a comparison of a peak position of the resolution or the contrast between the center position and each of the at least four positions in the peripheral part shows that a difference in peak position of the resolution or the contrast between the center position and the each of the at least four positions in the peripheral part exceeds a given value, the control section (control section 17) controlling at least one of (i) the suction head (lens unit suction head 14, 19) and (ii) the chucking or suction device (chucking or suction device 23) to change the position and the orientation of the optical member (lens section 50) such that the center position is identical, in peak position of the resolution or the contrast, to the each of the at least four positions in the peripheral part so that a tilt is corrected.

With the configuration, even in a case where the above method of carrying out image recognition increases an amount of the positional displacement (X-Y positional displacement) which occurs in a direction vertical to an optical axis due to a tilt of the suction head and a tilt of the chucking or suction device, the positional displacement can be improved by the tilt correction which is carried out through the image capturing.

In addition to the above configuration, an embodiment of the optical member conveying device (optical member conveying device 90) in accordance with the present invention is preferably configured to further include a chart (chart 22) for checking a resolution or a contrast, by use of which chart a resolution or a contrast is checked by the photoelectric conversion section (imaging sensor chip 8, effective pixel area 8s), while the photoelectric conversion section (imaging sensor chip 8, effective pixel area 8s) of the sensor section (sensor section 60) is operating, the control section (control section 17) controlling at least one of (i) the adhesion head (lens unit suction head 14, 19) and (ii) the chucking or suction device (chucking or suction device 23) to change a distance from the optical member (lens section 50), which is temporarily mounted on the sensor section (sensor section 60), to the photoelectric conversion section (imaging sensor chip 8, effective pixel area 8s), while the distance is changing, the chart (chart 22) for checking a resolution or a contrast being used to obtain (i) a resolution or a contrast of a center position of the photoelectric conversion section (imaging sensor chip 8, effective pixel area 8s) and (ii) a resolution or a contrast of each of at least four positions in a peripheral part of the center position, in a case where a comparison of a peak position of the resolution or the contrast between the center position and each of the at least four positions in the peripheral part shows that a difference in peak position of the resolution or the contrast between the center position and the each of the at least four positions in the peripheral part exceeds a given value, the control section (control section 17) controlling at least one of (i) the suction head (lens unit suction head 14, 19) and (ii) the chucking or suction device (chucking or suction device 23) to change the position and the orientation of the optical member (lens section 50) such that the center position is identical, in peak position of the resolution or the contrast, to the each of the at least four positions in the peripheral part so that a tilt is corrected.

With the configuration, even in a case where the above method of carrying out image recognition increases an amount of the positional displacement (X-Y positional displacement) which occurs in a direction vertical to an optical axis due to a tilt of the suction head and a tilt of the chucking or suction device, the positional displacement can be improved by carrying out the tilt correction.

In addition to the above configuration, an embodiment of the optical member conveying device in accordance with the present invention is preferably configured to further include MTF measuring apparatus (MTF measuring apparatus 21) which carries out an examination of an MTF defocus characteristic of the optical member (lens section 50), the adhesion head having a through hole which is concentric with the opening hole, the MTF measuring apparatus (MTF measuring apparatus 21) being provided on each of (i) the side opposite to the side of the opening hole across the through hole and (ii) the side of the back surface of the optical member, the MTF measuring apparatus (MTF measuring apparatus 21) measuring (i) a defocus characteristic of a center position of the opening hole (opening hole 3a) and (ii) a defocus characteristic of each of at least four positions in a peripheral part of the center position, in a case where a comparison of a peak position of the defocus characteristic between the center position and each of the at least four positions in the peripheral part shows that a difference in peak position of the defocus characteristic between the center position and the each of the at least four positions in the peripheral part exceeds a given value, the control section (control section 17) controlling the suction head (lens unit suction head 14, 19) to change the position and the orientation of the optical member (lens section 50) such that the center position is identical, in peak position of the defocus characteristic, to the each of the at least four positions in the peripheral part so that a tilt is corrected.

With the configuration, even in a case where the above method of carrying out image recognition increases an amount of the positional displacement (X-Y positional displacement) which occurs in a direction vertical to an optical axis due to a tilt of the suction head and a tilt of the chucking or suction device, the positional displacement can be improved by the tilt correction which is carried out through the MTF measurement.

In addition to the above configuration, an embodiment of the optical member conveying device in accordance with the present invention is preferably configured to further include MTF measuring apparatus (MTF measuring apparatus 21) (i) being provided on each of (a) a side of a top surface of the optical member (lens section 50) and (b) the side of the back surface of the optical member and (ii) carrying out an examination of an MTF defocus characteristic of the optical member (lens section 50), the MTF measuring apparatus (MTF measuring apparatus 21) measuring (i) a defocus characteristic of a center position of the opening hole (opening hole 3a) and (ii) a defocus characteristic of each of at least four positions in a peripheral part of the center position, in a case where (a) a comparison of a peak position of the defocus characteristic between the center position and each of the at least four positions in the peripheral part shows that a difference in peak position of the defocus characteristic between the center position and the each of the at least four positions in the peripheral part exceeds a given value, the control section (control section 17) controlling at least one of (i) the adhesion head (lens unit suction head 14, 19) and (ii) the chucking or suction device (chucking or suction device 23) to change the position and the orientation of the optical member (lens section 50) such that the center position is identical, in peak position of the defocus characteristic, to the each of the at least four positions in the peripheral part so that a tilt is corrected.

With the configuration, even in a case where the above method of carrying out image recognition increases an amount of the positional displacement (X-Y positional displacement) which occurs in a direction vertical to an optical axis due to a tilt of the suction head and a tilt of the chucking or suction device, the positional displacement can be improved by the tilt correction which is carried out through the MTF measurement.

In addition to the above configuration, an embodiment of the optical member conveying device in accordance with the present invention is preferably configured to further include a tilt measuring device that (i) applies laser light to a mirror (mirror 24) which is provided on either a side of a top surface of the optical member conveying device or a side of the top surface of the optical member and (ii) measures a tilt on the basis of light reflected from the mirror, the control section controlling at least one of (i) the adhesion head (lens unit suction head 14, 19) and (ii) the chucking or suction device (chucking or suction device 23) to change the position and the orientation of the optical member so that a swing and tilt of the optical member, which swing and tilt is measured on the basis of measurement results obtained by the tilt measuring device, is corrected.

With the configuration, even in a case where the above method of carrying out image recognition increases an amount of the positional displacement (X-Y positional displacement) which occurs in a direction vertical to an optical axis due to a tilt of the suction head and a tilt of the chucking or suction device, the amount of the positional displacement can be improved by the tilt correction which is carried out through the MTF measurement.

Note that the present invention encompasses a method of positioning an optical member in a given position. In other words, the present invention is a correction device which corrects a position and an orientation of an optical member so as to position the optical member in a given position.

The present invention is not limited to the description of the embodiments above, but may be altered by a skilled person in the art within the scope of the claims. An embodiment based on a proper combination of technical means disclosed in different embodiments is encompassed in the technical scope of the present invention. Moreover, a new technical feature can be obtained from a proper combination of technical means disclosed in different embodiments.

INDUSTRIAL APPLICABILITY

The present invention is applicable to production of a camera module.

REFERENCE SIGNS LIST

1: Lens unit (optical member)
2: Retainer (circular member)
2e: Inner edge of retainer
2ee: Outer edge of retainer
3: Lens barrel (optical member)
3a: Opening hole of lens barrel
3e: Inner edge of lens barrel
3ee: Outer edge of lens barrel
4: Actuator unit
4a: Opening part of actuator unit
4e: Inner edge of actuator unit
4ee: Outer edge (rectangular outer peripheral edge) of actuator unit
5: Adhesive part
6: Sensor cover
7: Cover glass
8: Imaging sensor chip (sensor section)
8s: Effective pixel area
9: Adhesive resin
10: Substrate
11: Wire
12: Outer edge
13: Small LED illumination device (light emitting element)
14: Lens unit suction head
14a: Suction hole
14b: Through hole
15: Lens unit suction hose
16: Image recognition camera unit
17: Control section
18: Laser displacement gauge
19: Lens unit suction head
19a: Through hole
20: Small LED illumination device (light emitting element)
21: MTF measuring apparatus
22: Chart
23: Chucking or suction device
24: Mirror
25: Tilt measuring device
26: Resolution, contrast, or SFR value, MTF modulation value 27: Amount of extension of lens or distance between sensor and lens
28: Characteristic of center part
29: Peak position of resolution characteristic of center part
30: Characteristic of peripheral part
31: Peak position of resolution characteristic of peripheral part
32: Positional displacement amount of peak position of resolution characteristic of peripheral part
33: Direction in which peak position is shifted when tilt correction is carried out
40: Camera module
50: Lens section
60: Sensor section
71: Imaging lens
80: Lens unit suction unit
90: Optical member conveying device

The invention claimed is:

1. An optical member conveying device which (i) conveys, to a given position on a side, from which light enters, of a sensor section including a photoelectric conversion section, an optical member into which a lens is incorporated and (ii) aligns the optical member with the given position of the sensor section, comprising:
a holding section including at least one of (i) an adhesion head that changes a position and an orientation of the optical member while (a) adhering to a top surface of the optical member which top surface is an outer surface on a side, from which light enters, of the optical member and (b) holding the optical member and (ii) a chucking or suction device that changes the position and the orientation of the optical member while (a) making contact with a side surface of the optical member which side surface is adjacent to the top surface and (b) holding the optical member; and
a control section which controls the holding section to mount, in accordance with a projection image, the optical member in the given position of the sensor section while (i) the holding section is holding the optical member and (ii) a light emitting element which emits light from above the top surface of the optical member toward an opening hole (a) from which light enters and (b) which is provided on the top surface of the optical member is provided, the projection image being obtained by projecting, by use of light which is emitted from the light emitting element, the opening hole on a side of a back surface which side is opposite to a side of the top surface of the optical member.

2. The optical member conveying device as set forth in claim 1, wherein:
when viewed from the side of the back surface of the optical member, the optical member (i) has a rectangular outer peripheral edge or (ii) includes a member having a circular edge that is closer to a center of the optical member than the outer peripheral edge is; and
(i) in a case where image recognition of the outer peripheral edge carried out from the side of the back surface of the optical member in accordance with the projection image detects that the rectangular outer peripheral edge has changed in shape from rectangular to trapezoidal due to a swing and tilt of the optical member or (ii) in a case where image recognition of the circular edge carried out from the side of the back surface of the optical member in accordance with the projection image detects that the circular edge has changed in shape from circular to elliptical due to a swing and tilt of the optical member, the control section controls the holding section to change the position and the orientation of the optical member so that a tilt is corrected.

3. An optical member conveying device as set forth in claim 1, further comprising a laser displacement gauge which (i) applies, on the side of the back surface of the optical member, lasers to respective at least three positions which are located in an identical plane vertical to an optical axis of the optical member and (ii) measures a distance to each of the at least three positions,
the control section controlling the holding section to change the position and the orientation of the optical member so that a swing and tilt of the optical member, which swing and tilt is measured on the basis of measurement results obtained by the laser displacement gauge, is corrected.

4. An optical member conveying device as set forth in claim 1, further comprising a chart by use of which a resolution or a contrast is checked by the photoelectric conversion section,
the holding section including the adhesion head having a through hole which is concentric with the opening hole,
the chart being provided on a side opposite to a side of the opening hole across the through hole,
while the photoelectric conversion section of the sensor section is operating, the control section controlling the holding section to change a distance from the optical member, which is temporarily mounted on the sensor section, to the photoelectric conversion section,
while the distance is changing, the chart being used to obtain, through the through hole, (i) a resolution or a contrast of a center position of the photoelectric conversion section and (ii) a resolution or a contrast of each of at least four positions in a peripheral part of the center position,
in a case where a comparison of a peak position of the resolution or the contrast between the center position and each of the at least four positions in the peripheral part shows that a difference in peak position of the resolution or the contrast between the center position and the each of the at least four positions in the peripheral part exceeds a given value, the control section controlling the holding section to change the position and the orientation of the optical member such that the center position is identical, in peak position of the resolution or the contrast, to the each of the at least four positions in the peripheral part so that a tilt is corrected.

5. An optical member conveying device as set forth in claim 1, further comprising an MTF measuring apparatus which carries out an examination of an MTF defocus characteristic of the optical member,
the holding section including the adhesion head having a through hole which is concentric with the opening hole,
the MTF measuring apparatus being provided on each of (i) the side opposite to the side of the opening hole across the through hole and (ii) the side of the back surface of the optical member,
the MTF measuring apparatus measuring (i) a defocus characteristic of a center position of the opening hole and (ii) a defocus characteristic of each of at least four positions in a peripheral part of the center position,
in a case where a comparison of a peak position of the defocus characteristic between the center position and each of the at least four positions in the peripheral part shows that a difference in peak position of the defocus characteristic between the center position and the each of the at least four positions in the peripheral part exceeds a given value, the control section controlling the holding section to change the position and the orientation of the optical member such that the center position is identical, in peak position of the defocus characteristic, to the each of the at least four positions in the peripheral part so that a tilt is corrected.

6. An optical member conveying device as set forth in claim 1, further comprising a tilt measuring device that (i) applies laser light to a mirror which is provided on either a side of a top surface of the optical member conveying device or the side of the top surface of the optical member and (ii) measures a tilt on the basis of light reflected from the mirror, the control section controlling the holding section to change the position and the orientation of the optical member so that a swing and tilt of the optical member, which swing and tilt is measured on the basis of swing and tilt results obtained by the tilt measuring device, is corrected.

* * * * *